(12) United States Patent
Wang

(10) Patent No.: US 7,927,891 B2
(45) Date of Patent: Apr. 19, 2011

(54) SEMICONDUCTOR DEVICE AND METHOD FOR MANUFACTURING THE SAME

(75) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/647,937

(22) Filed: Dec. 28, 2009

(65) Prior Publication Data

US 2010/0105152 A1    Apr. 29, 2010

Related U.S. Application Data

(62) Division of application No. 11/023,576, filed on Dec. 29, 2004, now Pat. No. 7,772,628.

(30) Foreign Application Priority Data

Aug. 31, 2004    (JP) .................................. 2004-253093

(51) Int. Cl.
*H01L 21/00*    (2006.01)
(52) U.S. Cl. ..................... 438/3; 438/396; 257/E21.011; 257/E21.208; 257/E21.664
(58) Field of Classification Search .............. 438/3, 396, 438/399; 257/E21.011, 21.013, E21.208, 257/E21.664
See application file for complete search history.

(56) References Cited

U.S. PATENT DOCUMENTS

| 6,146,906 A | 11/2000 | Inoue et al. |
| 6,624,458 B2 | 9/2003 | Takamatsu et al. |
| 6,740,533 B2 | 5/2004 | Takamatsu et al. |
| 6,744,085 B2 | 6/2004 | Maruyama et al. |
| 2002/0117700 A1 | 8/2002 | Fox |
| 2002/0185668 A1 | 12/2002 | Takamatsu et al. |
| 2003/0080363 A1 | 5/2003 | Maruyama et al. |
| 2003/0213986 A1 | 11/2003 | Takamatsu et al. |
| 2004/0023417 A1 | 2/2004 | Cross |

FOREIGN PATENT DOCUMENTS

| EP | 1253627 A2 | 10/2002 |
| EP | 1263037 A2 | 12/2002 |
| GB | 2341726 A | 3/2000 |
| JP | 2000-091270 A | 3/2000 |
| JP | 2001-127262 A | 5/2001 |
| JP | 2002-064186 A | 2/2002 |
| JP | 2002-110934 A | 4/2002 |
| JP | 2002-134710 A | 5/2002 |
| JP | 2002-261251 A | 9/2002 |
| JP | 2002-324894 A | 11/2002 |
| JP | 2003-133531 A | 5/2003 |

OTHER PUBLICATIONS

Japanese Office Action mailed Feb. 9, 2010, issued in corresponding Japanese Application No. 2004-253093 (Partial Translation).

(Continued)

*Primary Examiner* — David Vu
*Assistant Examiner* — Earl N Taylor
(74) *Attorney, Agent, or Firm* — Westerman, Hattori, Daniels & Adrian, LLP

(57) ABSTRACT

A lower electrode film is formed above a semiconductor substrate first, and then a ferroelectric film is formed on the lower electrode film. After that, an upper electrode film is formed on the ferroelectric film. When forming the upper electrode, an $IrO_x$ film containing crystallized small crystals when formed is formed on the ferroelectric film first, and then an $IrO_x$ film containing columnar crystals is formed.

14 Claims, 47 Drawing Sheets

OTHER PUBLICATIONS

Inoue et al., "Smart Fabrication Process of an Ir-IrOx Top-Electrode on a PZT Film for Reliable FeRAM", Journal of the Electrochemical Society, 151, pp. GI 13-GI 18, (2004).

Office Action dated Apr. 6, 2007 issued in corresponding China Application No. 2004 10082004.5.

European Search Report dated May 7, 2007, issued in corresponding European Patent Application No. 04258145.

Callister, W., Materials Science and Engineering: An Introduction, 3rd Edition, 1994, 3.15 X-Ray Diffraction: Determination of Crystal Structures, pp. 52-56.

Korean Office Action dated Nov. 28, 2006 (mailing date), issued in corresponding Korean Patent Application No. 10-2004-0116537 with partial English translation.

P. Heremans et al., "Differential Optical PnpN Switch Operationg at 16 MHz with 250-fJ Optical Input Energy", Appl. Phys. Ltr. vol. 65, No. 1, Jul. 4, 1994, pp. 19-21.

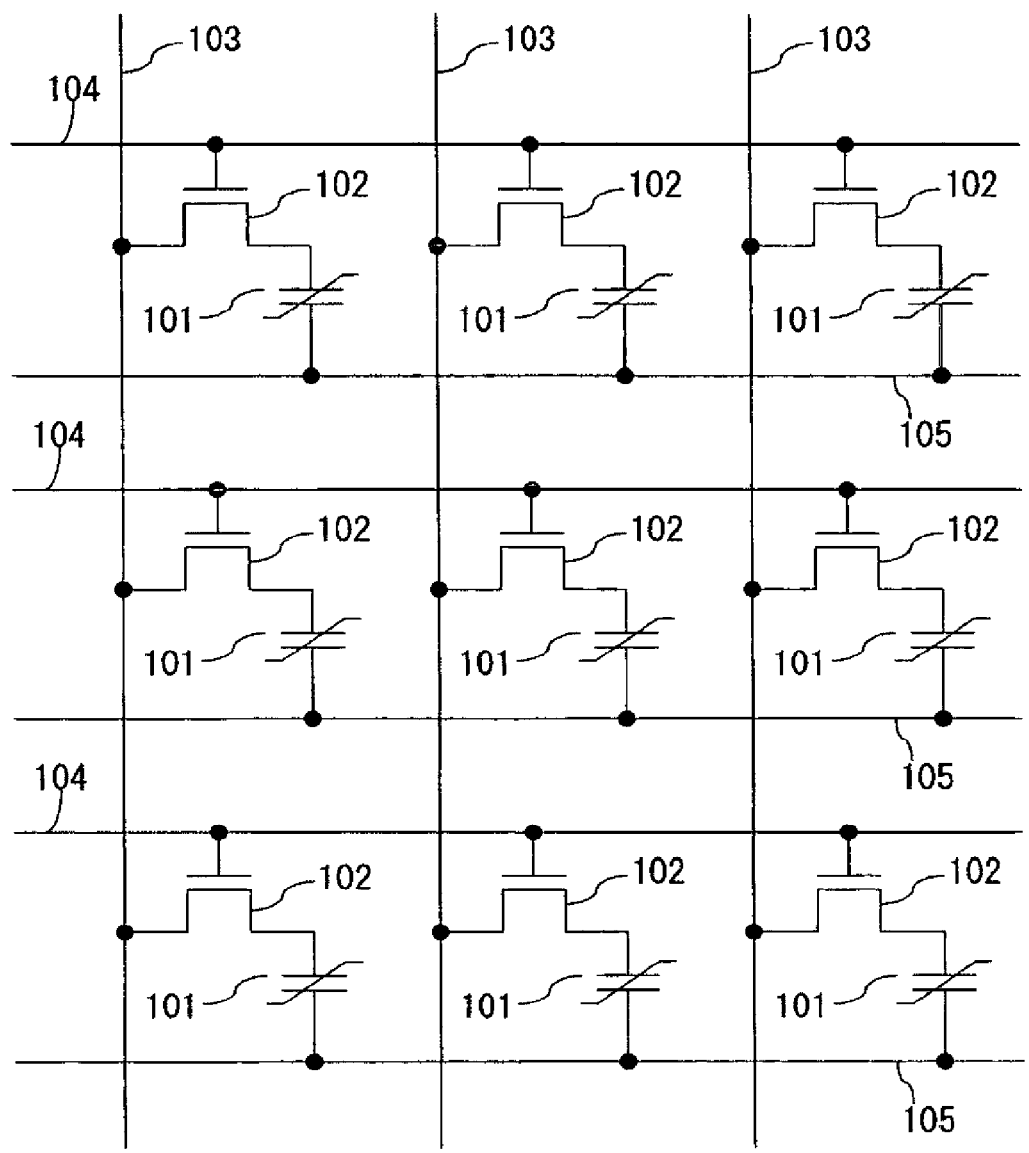

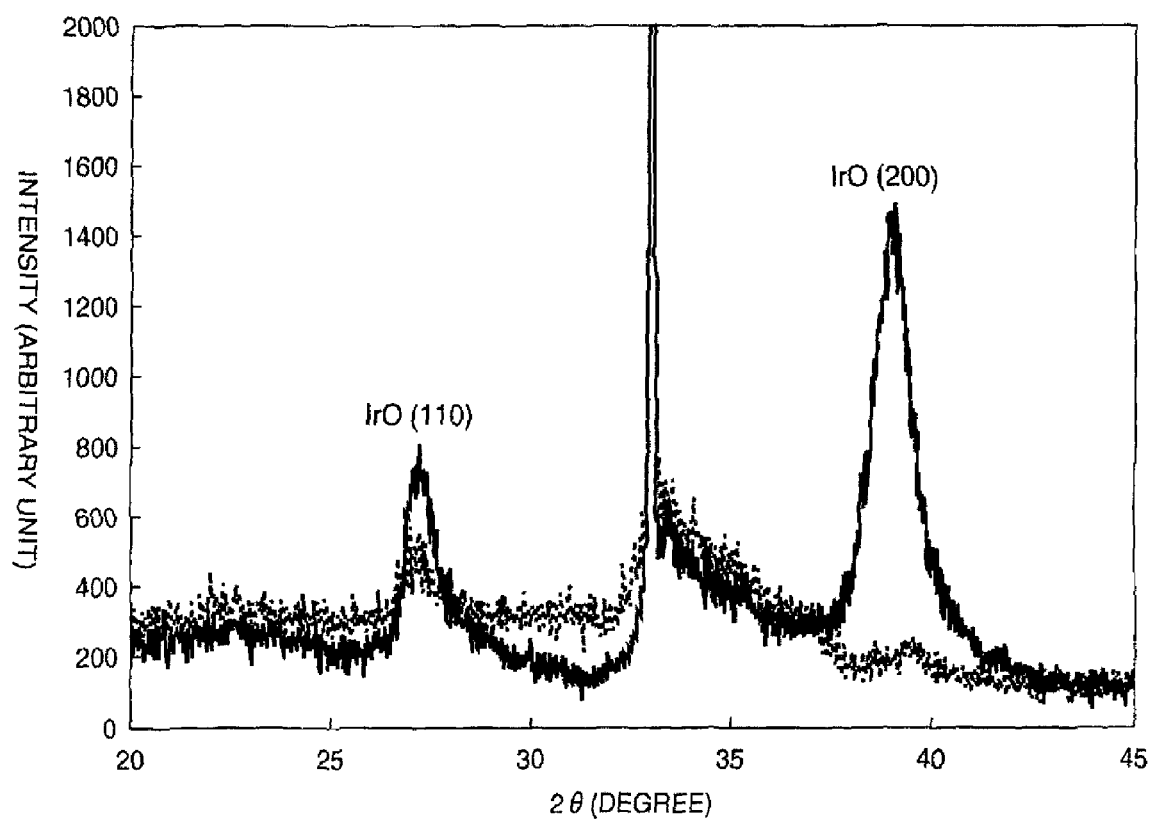

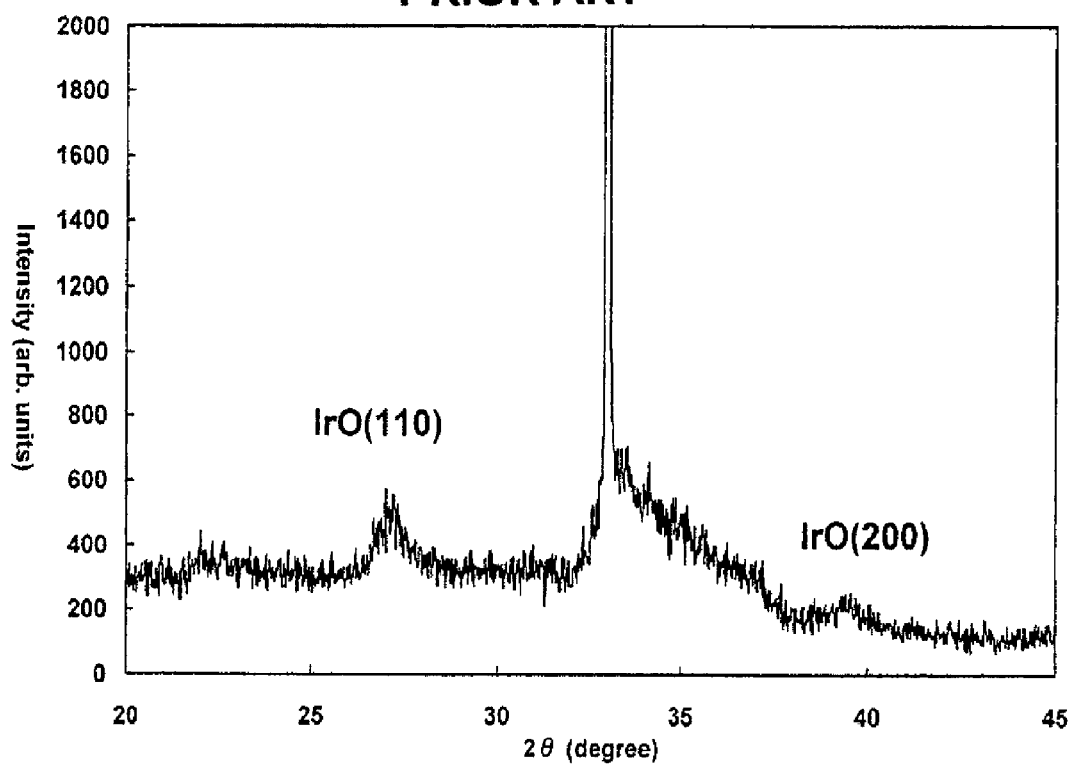

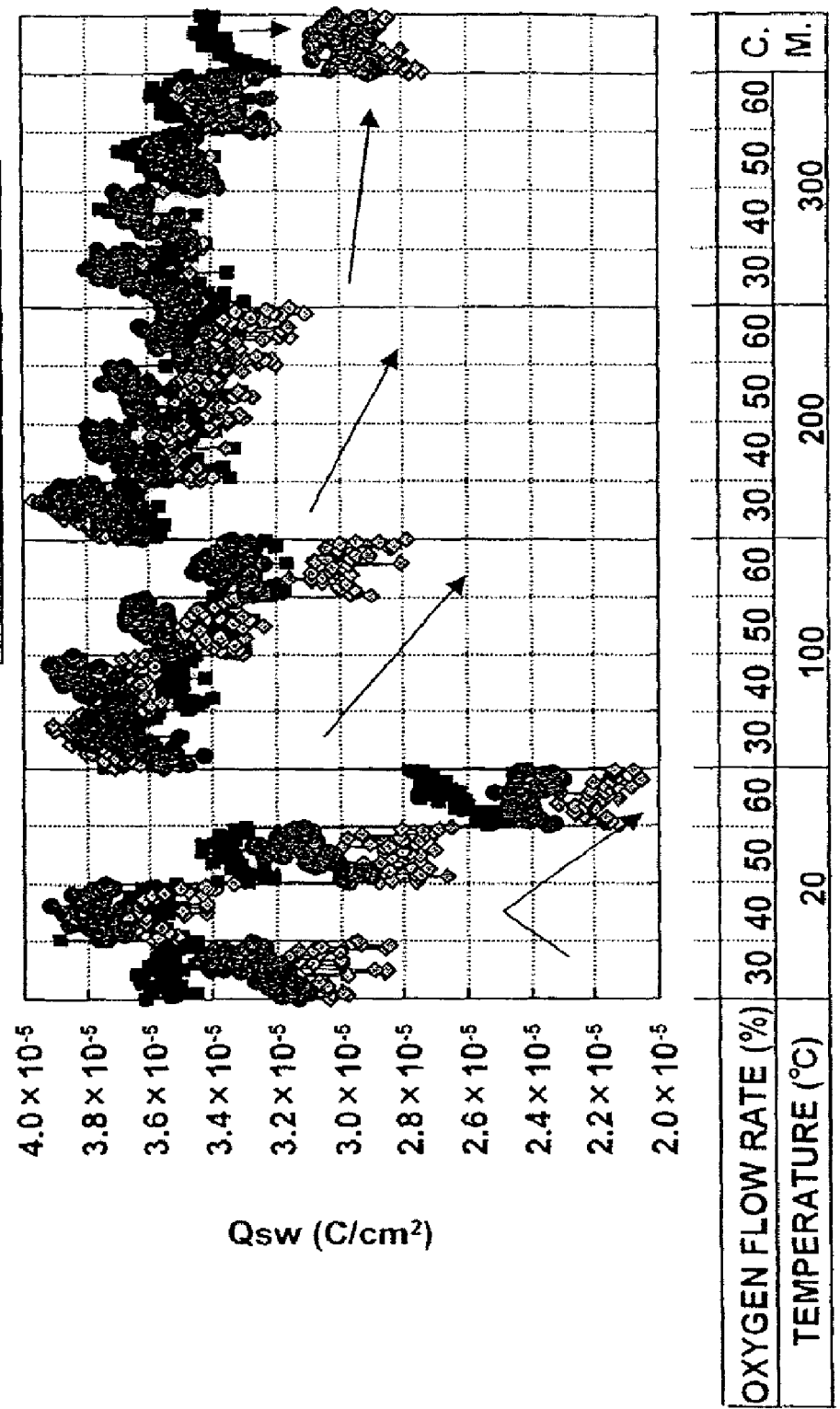

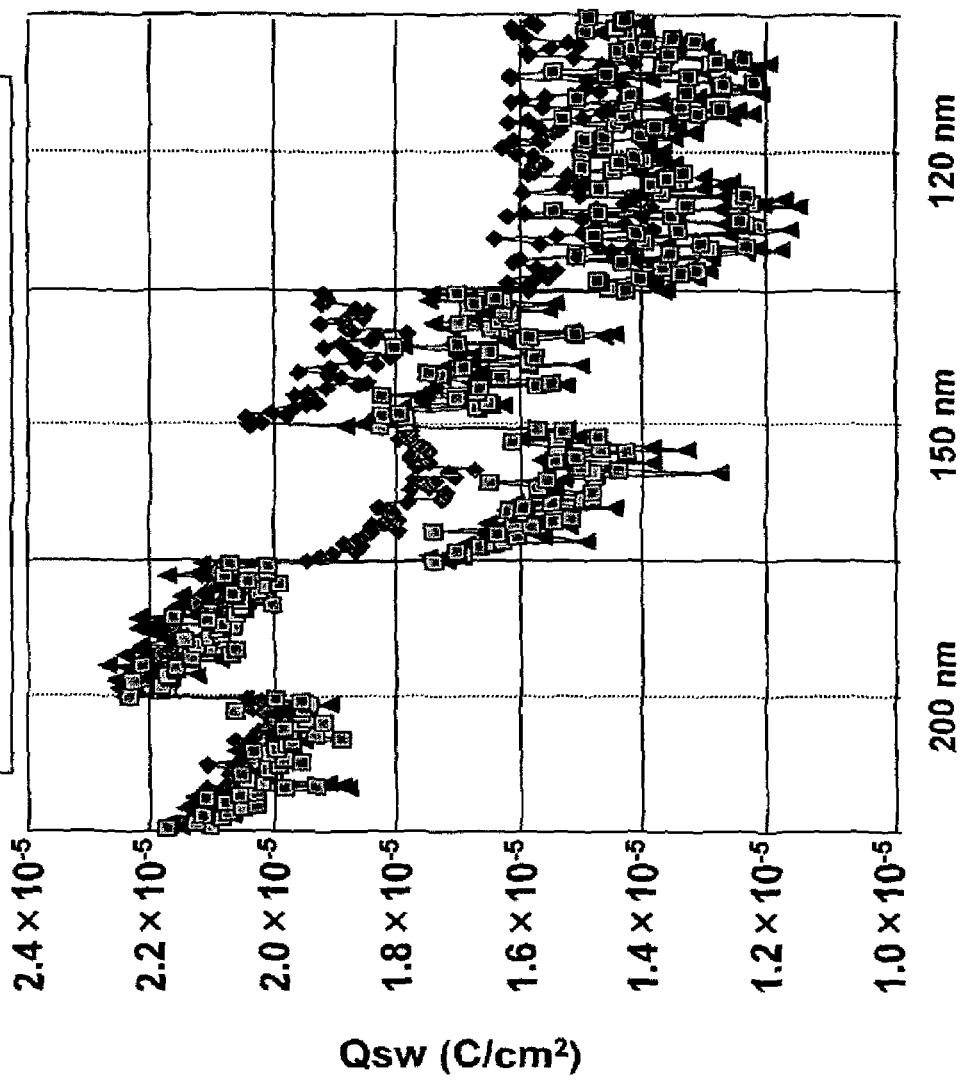

F I G. 2 3
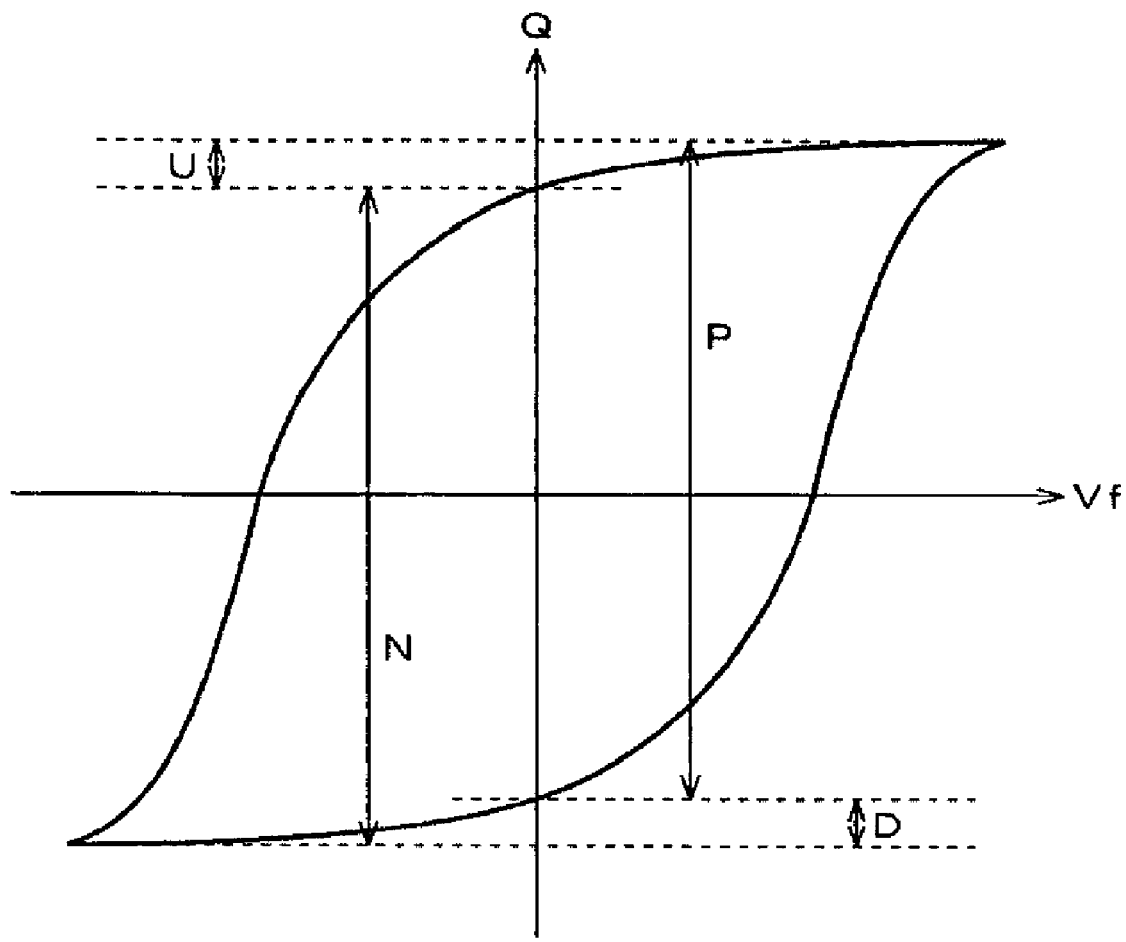

SEMICONDUCTOR DEVICE AND METHOD FOR MANUFACTURING THE SAME

CROSS-REFERENCE TO RELATED APPLICATIONS

This application is a division of U.S. application Ser. No. 11/023,576, filed on Dec. 29, 2004 which is based upon and claims the benefit of priority from the prior Japanese Patent Application No. 2004-253093, filed on Aug. 31, 2004, the entire contents of which are incorporated herein by reference.

BACKGROUND OF THE INVENTION

1. Field of the Invention

The present invention relates to a semiconductor device suitable for a ferroelectric memory and a method for manufacturing the same.

2. Description of the Related Art

In recent years, along with the advancing digital technology, there is an increasing trend toward large-capacity data processing or storing at high speed. Accordingly, a semiconductor device used for electronic equipment is required to be highly integrated and to exhibit higher performance.

On the back of this, in the semiconductor memory devices, for instance, with an aim to realize higher integration of DRAM, a technology that adopts a ferroelectric material or a high dielectric constant material for a capacitor insulating film of a capacitor element composing the DRAM, as a substitute for a conventional silicon oxide or a silicon nitride, has begun to be researched and developed broadly.

In addition, in order to realize a nonvolatile RAM capable of performing write operation and read operation at low voltage as well as high speed, a technology adopting a ferroelectric film having spontaneous polarization characteristic, as a capacitor insulating film, is also actively researched and developed. Such a semiconductor memory device is called a ferroelectric memory (FeRAM).

The ferroelectric memory stores information by taking advantage of a hysteresis characteristic of the ferroelectric memory. The ferroelectric memory is provided with a ferroelectric capacitor that is configured to have, as a capacitor dielectric film, a ferroelectric film in a manner sandwiched between a pair of electrodes. The ferroelectric film brings about polarization according to applied voltage between the electrodes, and has spontaneous polarization even if the applied voltage is removed. Besides, if the polarity of the applied voltage is inversed, then the polarity of the spontaneous polarization is also inversed. Accordingly, the detection of the spontaneous polarization allows reading out the information. The ferroelectric memory operates at a voltage lower than that for operating a flash memory, enabling a power-saving and high-speed write operation.

It should be noted that, when manufacturing a ferroelectric capacitor, a thermal treatment under an oxygen environment needs to be conducted two times or more to recover damage caused in the ferroelectric film. Therefore, as a material for an upper electrode, a metal being difficult to be oxidized even under the oxygen environment, such as platinum or the like, or otherwise a conductive oxide such as $IrO_x$, $RuO_x$, or the like, is employed.

In APPL. Phys. Lett. 65, P.19 (1994) (Non-patent document 1), there is a description saying that, as a material of an upper electrode and a lower electrode sandwiching a ferroelectric film formed of PZT (Pb (Zr, Ti) $O_3$), the use of iridium oxide ($IrO_2$) can prevent the ferroelectric capacitor from fatigue to thereby ensure favorable capacitance characteristics. However, it is known that, with the use of the $IrO_2$ electrode, an abnormally grown large crystal formed of $IrO_2$ is apt to be generated on the surface of the electrode. Such a large crystal causes to produce a defect, degrades electric characteristics of the ferroelectric capacitor, and eventually lowers the yield of the semiconductor device.

Further, in Japanese Patent Application Laid-Open No. 2001-127262 (Patent document 1), for the purpose of solving the above-stated problem, there is disclosed a two-step sputtering method, in which an $IrO_2$ film is formed at low power and further an $IrO_2$ film is formed at high power thereafter. In Japanese Patent Application Laid-Open No. 2000-91270 (Patent document 2), for the same purpose, there is disclosed a method, in which an Ir film and an $IrO_2$ film are formed in a row. Further, for reducing holes in the ferroelectric film, there is also disclosed a method in which an $IrO_2$ film is formed followed by a RTA (Rapid Thermal Annealing) and further an Ir film is formed.

Similar to the other semiconductor devices, the ferroelectric memories are also demanded a miniaturization, low-voltage operation, and so forth. In the ferroelectric memory manufactured by the previously-described conventional method, however, the decline in the polarization inversion amount (switching charge amount) $Q_{sw}$, which is caused together with the ferroelectric film being thinned, becomes more significant, and at the same time the coercive voltage becomes difficult to decline. When the polarization inversion amount declines, the ferroelectric memory becomes difficult to operate at low voltage, and when the coercive voltage is difficult to decline, the speed of inverting polarity becomes difficult to be improved.

SUMMARY OF THE INVENTION

It is an object of the present invention to provide a semiconductor device capable of bringing out the characteristics of a ferroelectric film even if the ferroelectric film is thinned, and a method for manufacturing of the same.

With respect to the performance of a ferroelectric capacitor manufactured by a conventional method (the method described in Patent document 1), the present inventor made measurements of polarization inversion amounts and coercive voltages. As a result, the results shown in FIGS. 22A and 22B were obtained.

FIG. 22A is a graph showing the relation between a thickness and the polarization inversion amount $Q_{sw}$ of the ferroelectric film. ♦ and ▲ show the result of a ferroelectric capacitor (discrete) of a square having a side of 50 μm, and ■ shows the result of a ferroelectric capacitor (cell capacitor) of a rectangular having a long side of 1.60 μm and a short side of 1.15 μm (average of 1428 cell capacitors). Note that ▲ and ■ show the result of the measurements made after the formation of a wiring on an upper electrode, and ♦ shows the result of the measurement made before the formation of such a wiring.

FIG. 22B is a graph showing the relation between the thickness and the coercive voltage Vc of the ferroelectric film. For measuring the coercive voltage Vc, a hysteresis loop indicating the relation between an applied voltage and a polarization amount is obtained as shown in FIG. 23, and various values are obtained from this hysteresis loop. After the relation between the applied voltage and a value P is obtained, the applied voltage at the time when the value P has the largest variation ratio with respect to the variation in the applied voltage is defined as the coercive voltage Vc. Note that ♦ indicates the coercive voltage Vc (−) in the case of the negative variation ratio, and ▲ indicates the coercive voltage Vc (+) in the case of the positive variation ratio. Further, the polarization inversion amount $Qs_w$ is a value obtained by formula 1 below using the values P, U, N and D obtained from the hysteresis loop.

$$Q_{SW} = \frac{(P-U)+(N-D)}{2} \quad \text{Formula 1}$$

As shown in FIG. 22A, it was confirmed that the polarization inversion amount $Q_{sw}$ showed a significant decline in accordance with the ferroelectric film becoming thinner. In addition, as shown in FIG. 22B, as the ferroelectric film became thinner, the coercive voltage Vc became more difficult to decline.

After due diligent considerations of this cause, the present inventor has found that the conventional manufacturing method causes to degrade ferroelectric characteristic when forming the upper electrode on the ground that the upper portion of the ferroelectric film reacts with a material of the upper electrode.

FIG. 4A is a schematic diagram showing the conventional manufacturing method. As shown in FIG. 4A, even if the ferroelectric film such as a PZT film or the like is formed to have a thickness d, there is caused a cross reaction by a thermal treatment or the like conducted after the formation of the upper electrode to thereby form an interface layer between the upper electrode and the ferroelectric film, and then, a portion of $d_1$ becomes unable to operate enough as a ferroelectric. In the conventional method, the film formed on the ferroelectric film is in an amorphous state at its lower portion and has columnar crystals existing on the portion. Therefore, in the course of a recovery annealing or so forth, large crystal grains appear at the portion of the amorphous state to cause the above-mentioned interface layer to be comparatively thicker, so that the thickness $d_1$ that does not operate enough as a ferroelectric becomes large as well. As a result, the polarization inversion amount $Q_{sw}$ declines, an initial rise in the graph showing variations of the polarization inversion amount $Q_{sw}$ with respect to the applied voltage becomes slow, and the coercive voltage Vc increases. Furthermore, since the thickness $d_1$ is considered to scarcely depend on the thickness of the ferroelectric film, as the ferroelectric film becomes thinner, the ration of the portion not operating enough as a ferroelectric increases, so that the above-described problem is becoming significant.

Furthermore, with the growth of the crystal grain in size, vacancy between the crystals increases. The degradation of the characteristics of the ferroelectric capacitor as described above becomes significant even if the frequency of treatments conducted under a reducing atmosphere or a non-oxidizing atmosphere for forming a multi-layered structure is increased. Specifically, when the upper electrode includes a metal film such as a Pt film, an Ir film, or the like, hydrogen used when forming an interlayer insulating film in the multi-layered structure intrudes into the metal film, and is activated by catalytic action of these metals. Then, the activated hydrogen reduces the ferroelectric film. When the ferroelectric film is reduced, the ferroelectric capacitor greatly degrades in its operating characteristics. This is considered due to the presence of lots of paths for hydrogen to diffuse backed by the increase of the vacancy between crystals.

For such a phenomenon, the present inventor has devised that, by forming a crystallized conductive oxide film such as a crystallized $IrO_x$ film or the like at the lowest layer of the upper electrode when forming the upper electrode, it is possible to prevent generation of coarse and large crystals and secure a larger portion of the ferroelectric film operating as a ferroelectric, in other words, it is possible to prevent generation of the interface layer as well as diffusion of the hydrogen, as shown in FIGS. 4B and 4c. Note that FIG. 4B is a schematic diagram showing the state of an interface layer generated and how hydrogen diffuses in the case where a conductive oxide film formed of extremely minute crystals is formed when forming the upper electrode, and FIG. 4C is a schematic diagram showing the state of an interface layer generated and how hydrogen diffuses in the case where a conductive oxide film formed of larger crystals than those shown in FIG. 4B is formed. Consequently, the present inventor has devised embodiments of the present invention as will be described below.

A semiconductor device according to the present invention includes a semiconductor substrate, a lower electrode formed above the semiconductor substrate, a ferroelectric film formed on the lower electrode, and an upper electrode formed on the ferroelectric film. The upper electrode includes a conductive oxide film that is crystallized when formed at a lowest layer of the upper electrode.

In a method for manufacturing a semiconductor device according to the present invention, a lower electrode film is formed above a semiconductor substrate, thereafter, a ferroelectric film is formed on the lower electrode film. Then, an upper electrode is formed on the ferroelectric film. In the upper electrode forming step, a conductive oxide film that is crystallized when formed is formed on the ferroelectric film and at the lowest layer of said upper electrode.

BRIEF DESCRIPTION OF THE DRAWINGS

FIG. 1 is a circuit diagram showing a memory cell array of a ferroelectric memory manufactured by a method according to an embodiment of the present invention;

FIG. 5A is a graph showing an orientation of an initial layer of an upper electrode film;

FIG. 5B is a graph showing an orientation of an initial layer formed by a conventional method;

FIG. 18B is a graph showing a result of the twelfth test (3.0 V);

FIG. 22A is a graph showing a relation between a thickness and a polarization inversion amount $Q_{sw}$ of a ferroelectric film;

FIG. 23 is a graph showing the relation between an applied voltage and a polarization amount.

DETAILED DESCRIPTION OF THE PREFERRED EMBODIMENTS

Hereinafter, an embodiment of the present invention will be described concretely with reference to the attached drawings. FIG. 1 is a circuit diagram showing a configuration of a memory cell array of a ferroelectric memory (semiconductor device) that is manufactured by a method according to the embodiment of the present invention.

In this memory cell array, there are provided a plurality of bit lines 103 extending to one direction and a plurality of word lines 104 and plate lines 105 extending to the direction perpendicular to the extending direction of the bit lines 103. Further, a plurality of memory cells of the ferroelectric memory according to the present embodiment are arranged in an array to match with grids structured by these bit lines 103, word lines 104, and plate lines 105. Each of the memory cells is provided with a ferroelectric capacitor (memory portion) 101 and a MOS transistor (switching portion) 102.

A gate of the MOS transistor 102 is connected with the word line 104. One of source/drain of the MOS transistor 102 is connected with the bit line 103 and the other one of the source/drain is connected with one electrode of the ferroelectric capacitor 101. The other electrode of the ferroelectric capacitor 101 is connected with the plate line 105. Note that the respective word lines 104 and plate lines 105 are shared by the plurality of MOS transistors 102 aligned side by side in the same direction as of the word lines 104 and plate lines 105. Similarly, each of the bit lines 103 is shared by the plurality of MOS transistors 102 aligned side by side in the same direction as of the bit line 103. The direction in which the word line 104 and plate line 105 extend and the direction in which the bit line 103 extends may be called a row direction and a column direction, respectively.

In the memory cell array of the ferroelectric memory thus-configured, data are stored in accordance with the state of polarity of a ferroelectric film provided in the ferroelectric capacitor 101

Figure 2A:
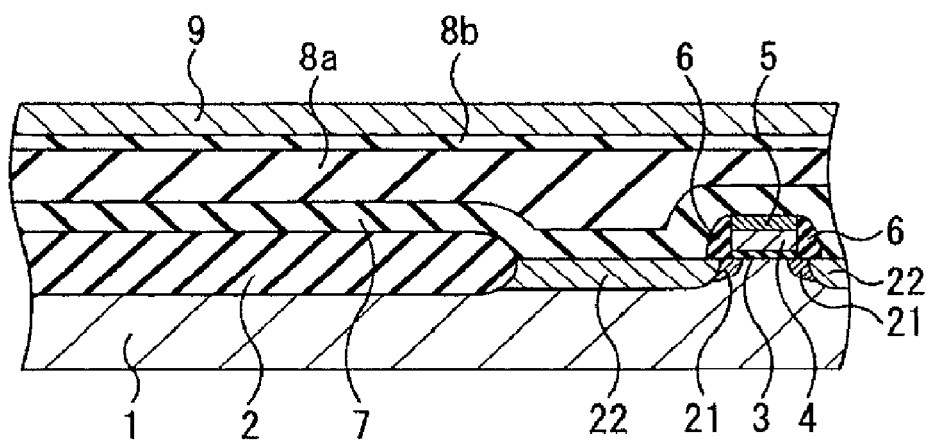
FIGS. 2A to 2N are cross sectional views showing a method for manufacturing a ferroelectric memory according to an embodiment of the present invention in the order of steps.

Next, the embodiment of the present invention will be described. For the purpose of convenience, the cross-sectional structure of each memory cell of the ferroelectric memory will be described along with the method for manufacturing the same. FIGS. 2A to 2N are cross-sectional views showing the method for manufacturing the ferroelectric memory (semiconductor device) according to the embodiment of the present invention in the order of steps.

In the present embodiment, first, as shown in FIG. 2A, an element isolation insulating film 2 partitioning an element active region is formed on the surface of a semiconductor substrate 1 of a silicon substrate or the like for example by a LOCOS (Local Oxidation of Silicon) method. Next, in the element active region defined by the element isolation insulating film 2, there are formed a gate insulating film 3, a gate electrode 4, a silicide layer 5, a sidewall 6, and a transistor (MOSFET) that is provided with a source/drain diffusion layer constituted by a low-concentration diffusion layer 21 and a high-concentration diffusion layer 22. As the gate insulating film 3, for example, a $SiO_2$ film of a thickness of approximately 100 nm is formed by a thermal oxidation. Subsequently, a silicon oxynitride film 7 is formed over the entire surface so as to cover the MOSFET and further a silicon oxide film 8a is formed over the entire surface. The silicon oxynitride film 7 is formed to prevent the gate insulating film 3 or the like from hydrogen-induced degradation when forming the silicon oxide film 8a. As the silicon oxide film 8a, a TEOS (tetraethylorthosilicate) film of a thickness of approximately 700 nm is formed, for example, by a CVD method.

Subsequently, the silicon oxide film 8a is degassed through an annealing treatment under a $N_2$ atmosphere at 650° C. for 30 minutes. Subsequently, as a lower electrode adhesion film, an $Al_2O_3$ film 8b of a thickness of approximately 20 nm is formed on the silicon oxide film 8a, for example, by sputtering. Incidentally, a titanium film, a $TiO_x$ film, or the like of a thickness of approximately 20 nm may be formed instead as the lower electrode adhesion film. Subsequently, a lower electrode film 9 is formed on the $Al_2O_3$ film 8b as the lower electrode adhesion film. As the lower electrode film 9, a platinum film of a thickness of approximately 150 nm is formed, for example, by sputtering. In the case of forming the titanium film of a thickness of approximately 20 nm as the lower electrode adhesion film, a multi-layered body constituted by a titanium film of a thickness of 20 nm and a platinum film of a thickness of 180 nm may be formed. At this time, for example, the titanium film may be formed at a temperature of 150° C. and the platinum film may be formed at 100° C. or 350° C.

Figure 2B:
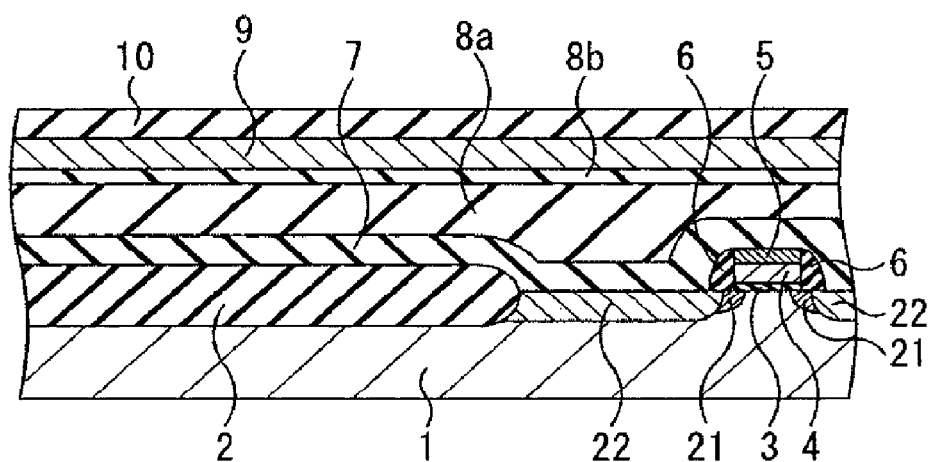

Subsequently, as shown in FIG. 2B, a ferroelectric film 10 is formed on the lower electrode film 9 to be in an amorphous state. As the ferroelectric film 10, a PLZT ((Pb, La) (Zr, Ti) $O_3$) film of a thickness of approximately 100 nm to 200 nm is formed, for example, by a RF sputtering method using a PLZT target. Subsequently, a thermal treatment (RTA: Rapid Thermal Annealing) under the atmosphere including Ar and $O_2$ at 650° C. or below, and further an RTA under an oxygen atmosphere at 750° C. are conducted. As the result, the ferroelectric film 10 is crystallized completely and the Pt film constituting the lower electrode film 9 is densified, so that mutual diffusion of platinum and oxygen in the vicinity of the interface between the lower electrode film 9 and the ferroelectric film 10 is suppressed.

Figure 2C:
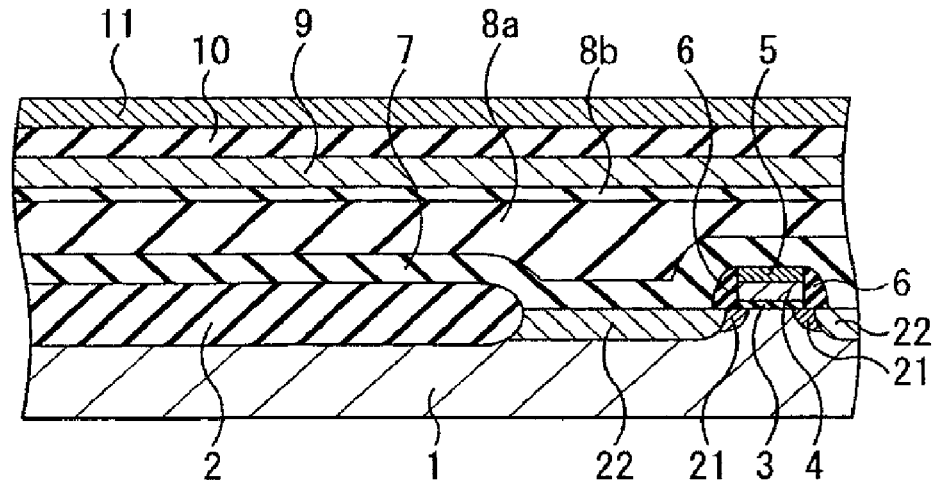
Figure 3A:
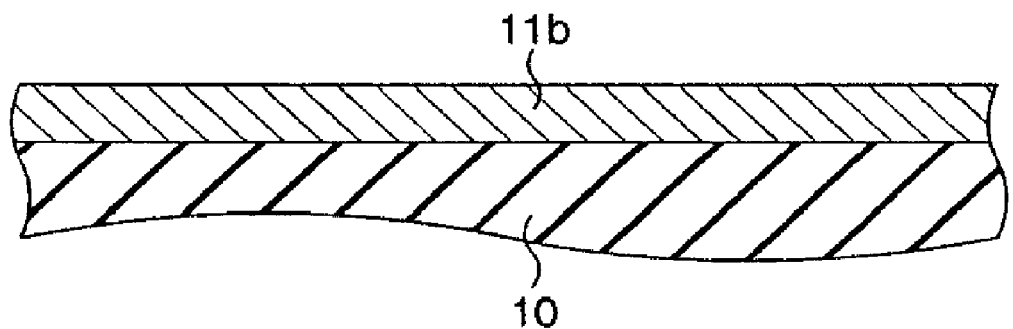
FIGS. 3A to 3B are cross sectional views showing a method for forming an upper electrode film 11 in the order of steps.
Figure 3B:
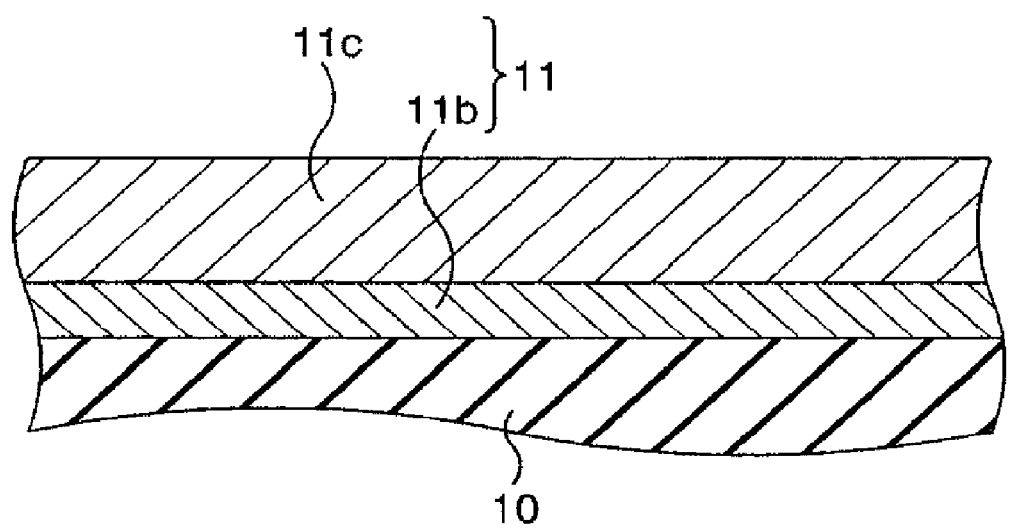
Figure 4A:
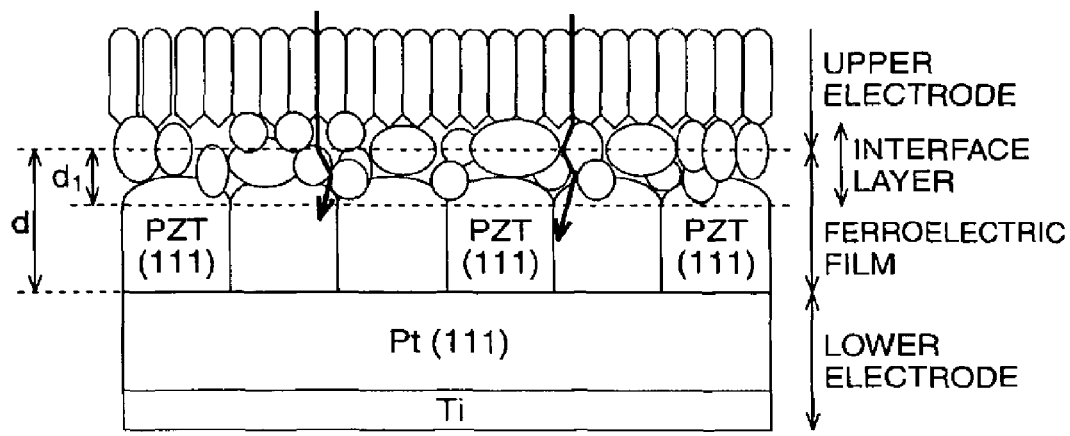
FIG. 4A is a schematic diagram showing a conventional manufacturing method.
Figure 4B:
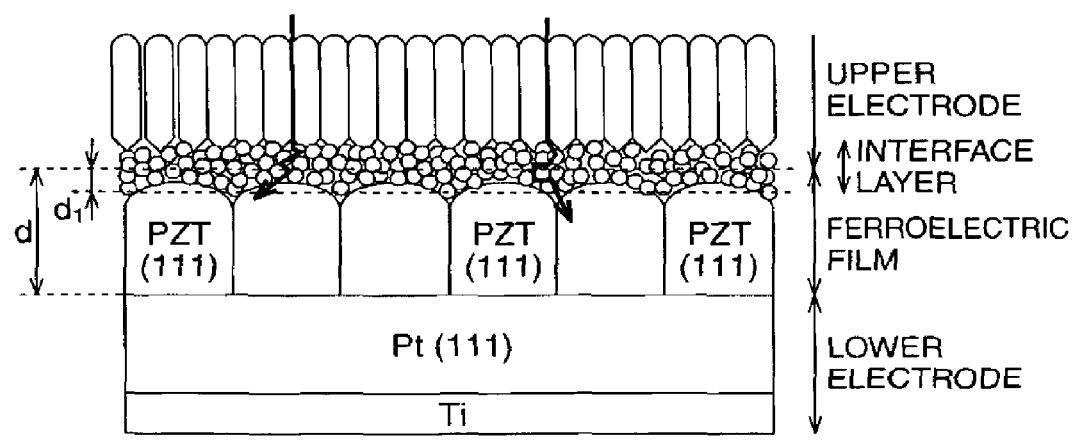
FIG. 4B is a schematic diagram showing a state of an interface layer and how hydrogen diffuses in the case of forming a conductive oxide film formed of extremely small crystals when forming the upper electrode.
Figure 4C:
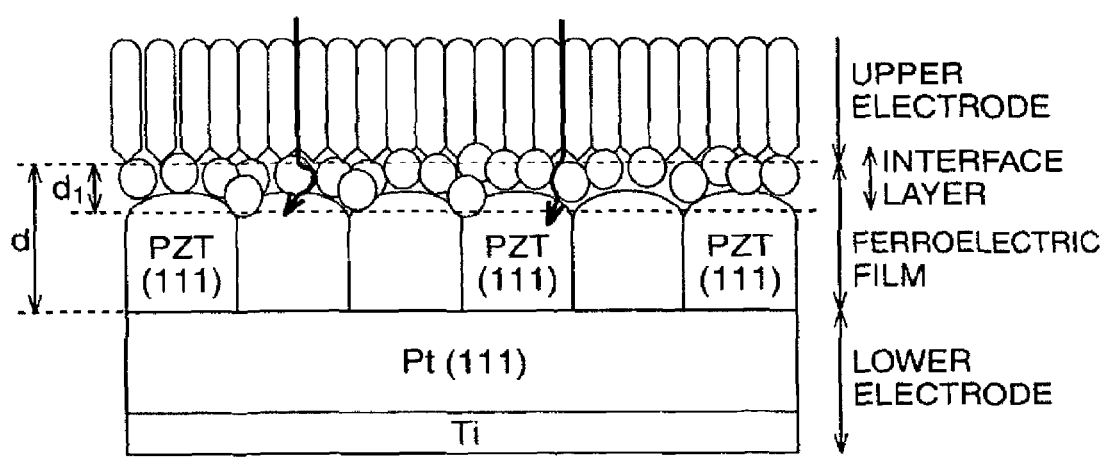
FIG. 4C is a schematic diagram showing the state of an interface layer and how hydrogen diffuses in the case of forming a conductive oxide film formed of larger small crystals than in the case shown in FIG. 4B.

Subsequently, as shown in FIG. 2C, an upper electrode film 11 is formed on the ferroelectric film 10. For forming the upper electrode film 11, first, as shown in FIG. 3A, an $IrO_x$ film 11b of a thickness of 50 nm that is crystallized when formed is formed on the ferroelectric film 10 by sputtering. For instance, the deposition temperature at this time is set at 300° C., and as a film-forming gas, Ar and $O_2$ are used both at a flow rate of 100 sccm. Then, the sputtering power is for example set to around 1 kW to 2 kW. After that, as shown in FIG. 3B, an $IrO_x$ film 11c of a thickness of 200 nm is formed on the $IrO_x$ film 11b by sputtering. The $IrO_x$ film 11c is not required to be crystallized when formed.

Figure 2D:
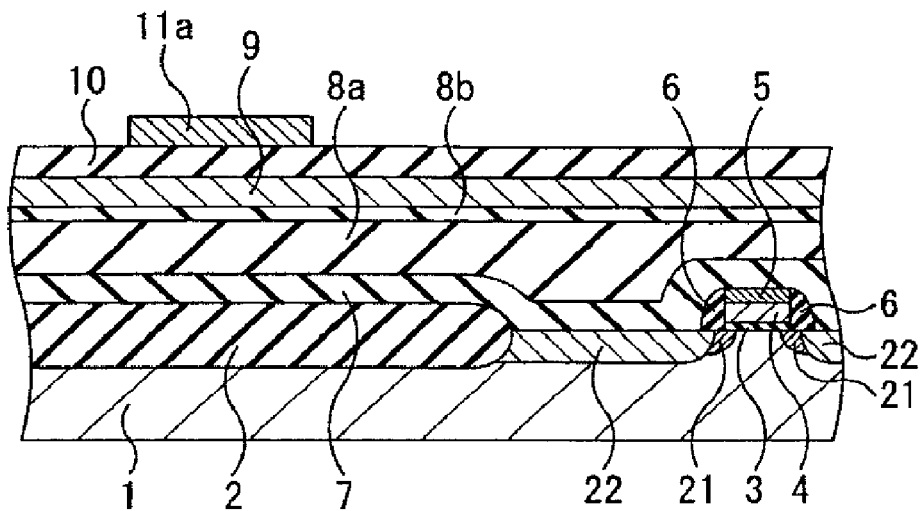

Following the above, a rear surface is cleaned, and, as shown in FIG. 2D, an upper electrode 11a is formed by and patterning the upper electrode film 11. Subsequently, a recovery annealing is conducted under an $O_2$ atmosphere at 650° C. for 60 minutes. This thermal treatment is conducted to recover a physical damage and the like that the ferroelectric film 10 suffered when forming the upper electrode 11a.

Figure 2E:
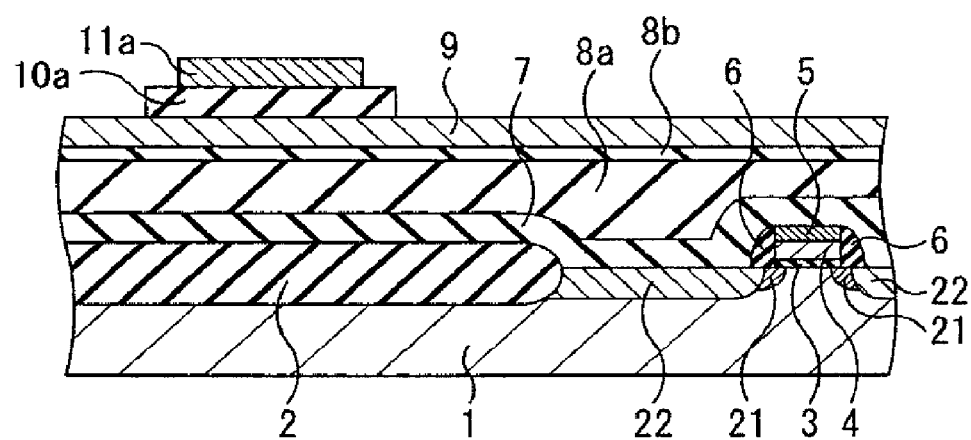

Subsequently, as shown in FIG. 2E, a capacity insulating film 10a is formed by patterning the ferroelectric film 10. After that, an oxygen annealing is conducted to prevent an $Al_2O_3$ film, which will be formed later, from peeling off.

Figure 2F:
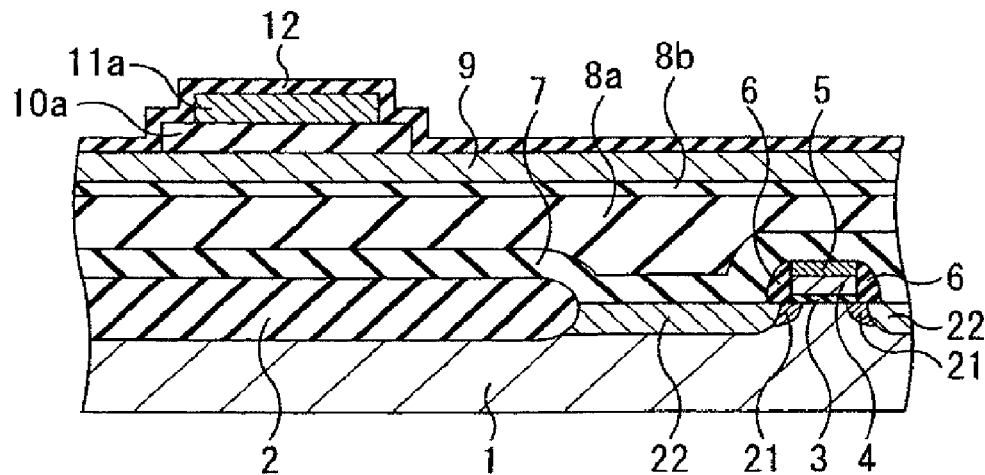

Subsequently, as shown in FIG. 2F, as a protective film, an $Al_2O_3$ film 12 is formed over the entire surface by sputtering. After that, for the purpose of alleviating damage caused by the sputtering, an oxygen annealing is conducted. With the protective film ($Al_2O_3$ film 12), the ferroelectric capacitor is prevented from receiving hydrogen intruding from the outside.

Figure 2G:
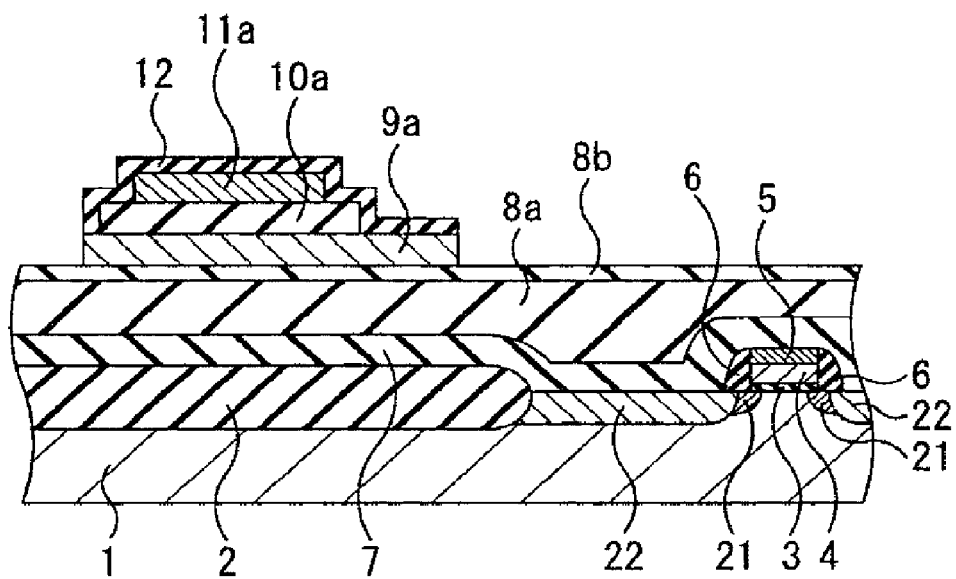

Subsequently, as shown in FIG. 2G, the $Al_2O_3$ film 12 and the lower electrode film 9 are patterned to form a lower electrode 9a. After that, oxygen annealing is conducted for preventing an $Al_2O_3$ film, which will be formed later, from peeling off.

Figure 2H:
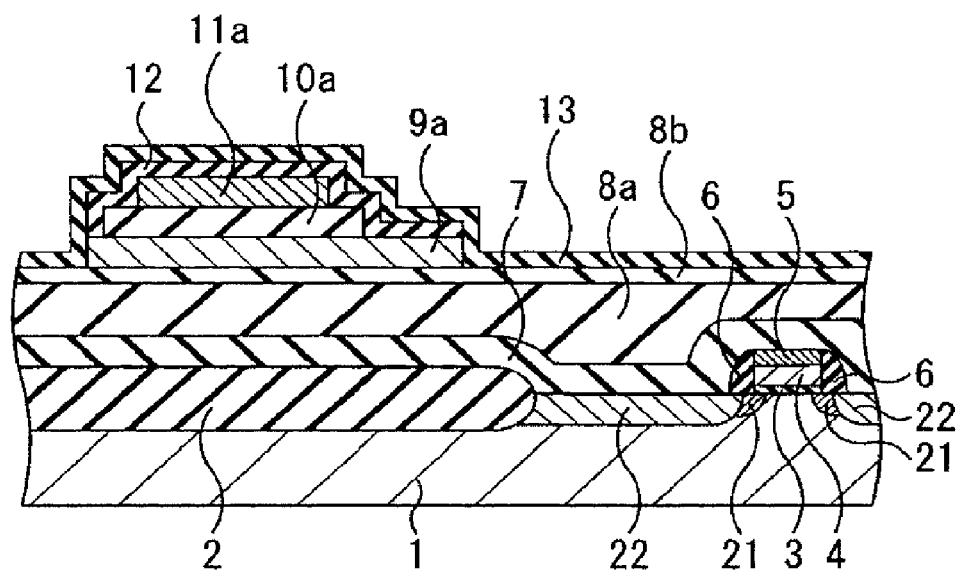

Next, as shown in FIG. 2H, as a protective film, an $Al_2O_3$ film 13 is formed over the entire surface by sputtering. After that, with an aim to reduce leakage current of the capacitor, an oxygen annealing is conducted.

Figure 2I:
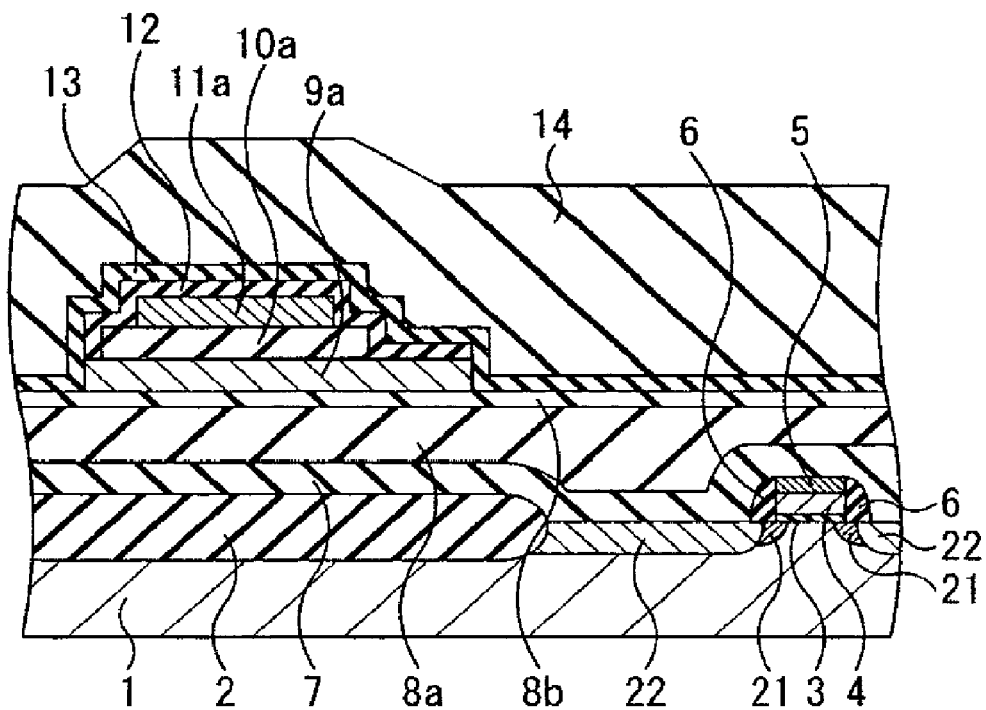

Subsequently, as shown in FIG. 2I, an interlayer insulating film 14 is formed over the entire surface by a high-density plasma process. The thickness of the interlayer insulating film 14 is set to approximately 1.5 µm, as an example.

Figure 2J:
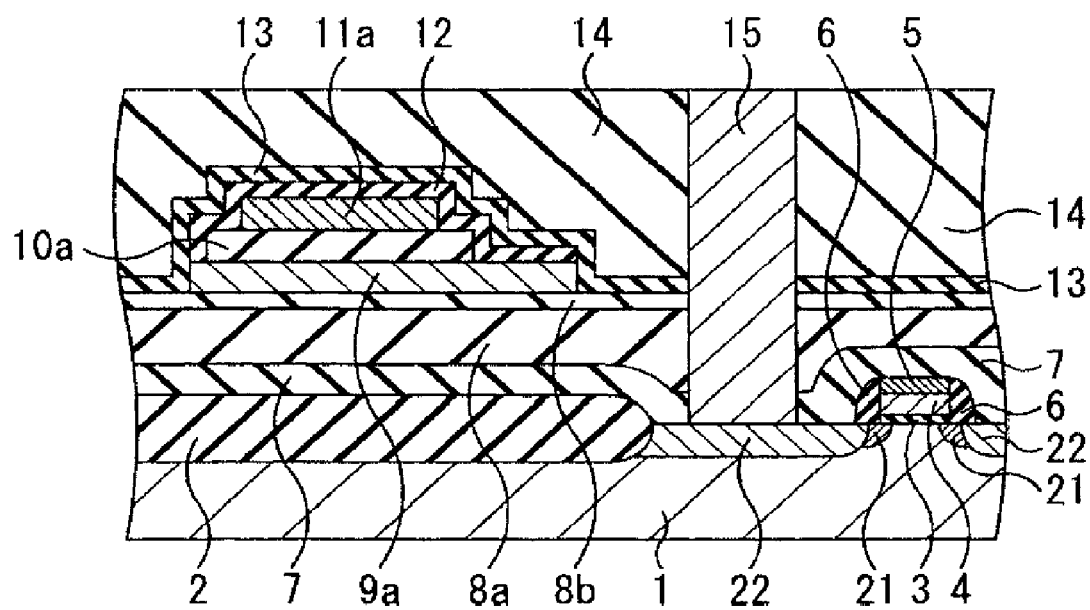

Subsequently, as shown in FIG. 2J, the interlayer insulating film 14 is flattened by a CMP (chemical mechanical polishing) method. After that, a plasma treatment is conducted using $N_2O$ gas. As the result, the surface portion of the interlayer insulating film 14 is slightly nitrided, so that moisture intrusion into the inside thereof becomes difficult. Note that the plasma treatment is effective when a gas containing at least either nitrogen or oxygen is employed. Subsequently, holes reaching to the high-concentration diffusion layer 22 of the transistor are formed through the interlayer insulating film 14, the $Al_2O_3$ film 13, the $Al_2O_3$ film 8b, the silicon oxide film 8a, and the silicon oxynitride film 7. After that, a Ti film and a TiN film are formed successively in the hole by sputtering to form a barrier metal film (not shown). After that, further, a W film is embedded into the hole by a CVD (chemical vapor deposition) method, and the W film is flattened by a CMP method to form a W plug 15.

Figure 2K:
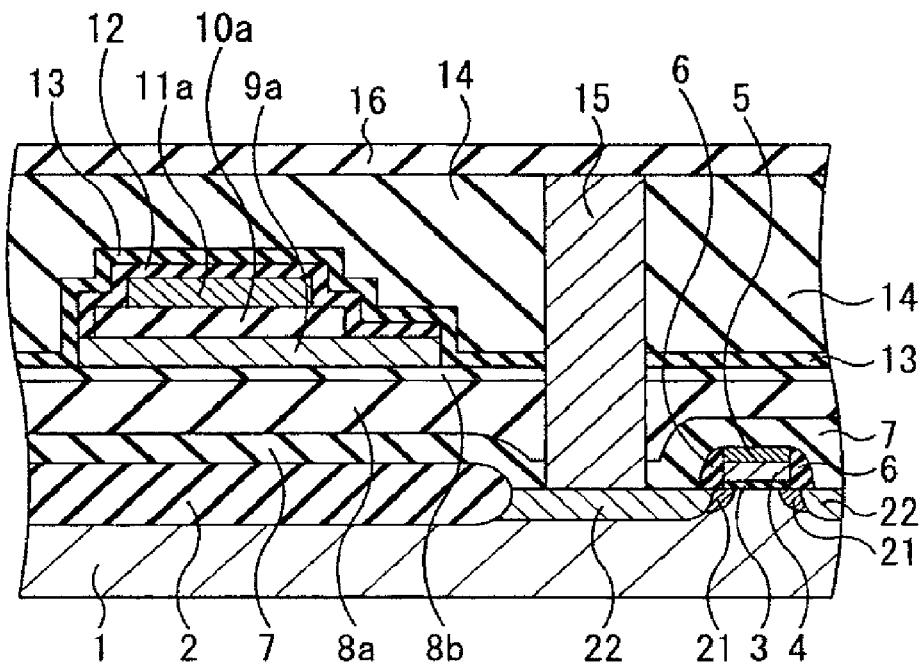

Subsequently, as shown in FIG. 2K, as an oxidation preventive film of the W plug 15, a SiON film 16 is formed for example by a plasma enhanced CVD method.

Figure 2L:
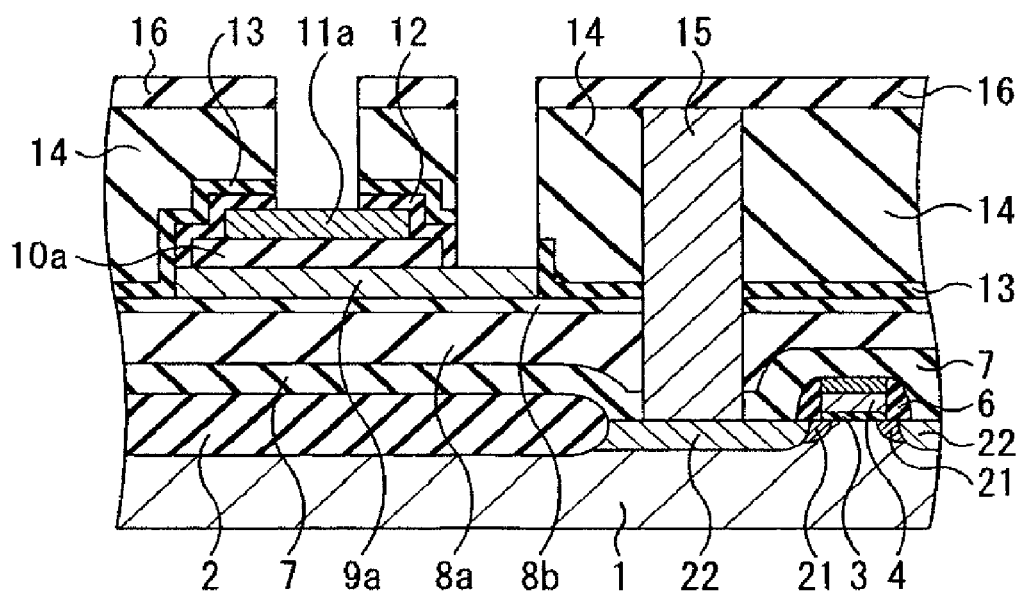

Subsequently, as shown in FIG. 2L, holes reaching to the upper electrode 11a and the lower electrode 9a, respectively, are formed through the SiON film 16, the interlayer insulating film 14, the $Al_2O_3$ film 13, and the $Al_2O_3$ film 12. After that, oxygen annealing is conducted to recover damage.

Figure 2M:
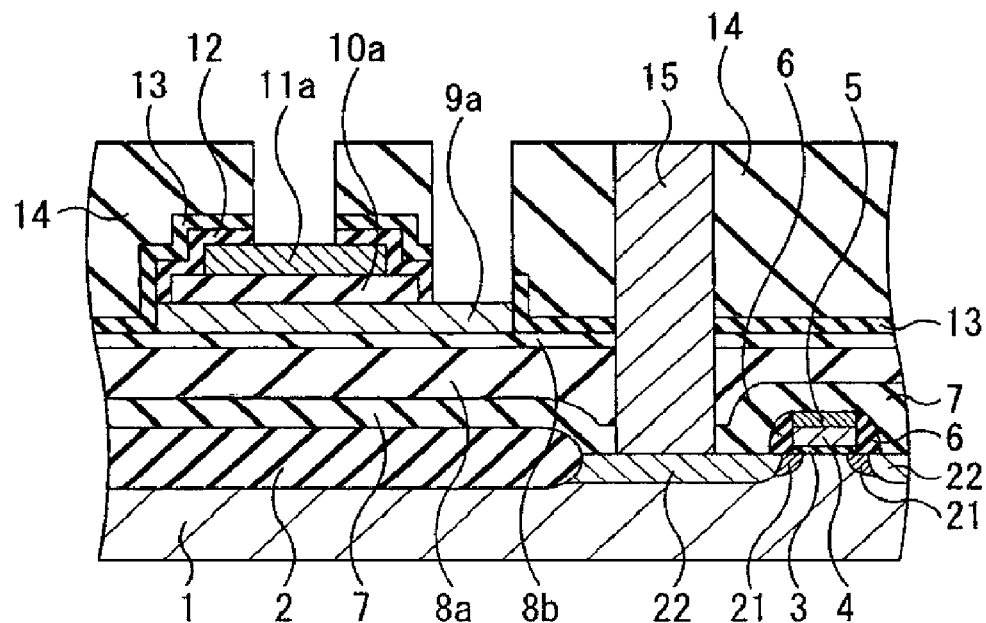
Figure 2N:
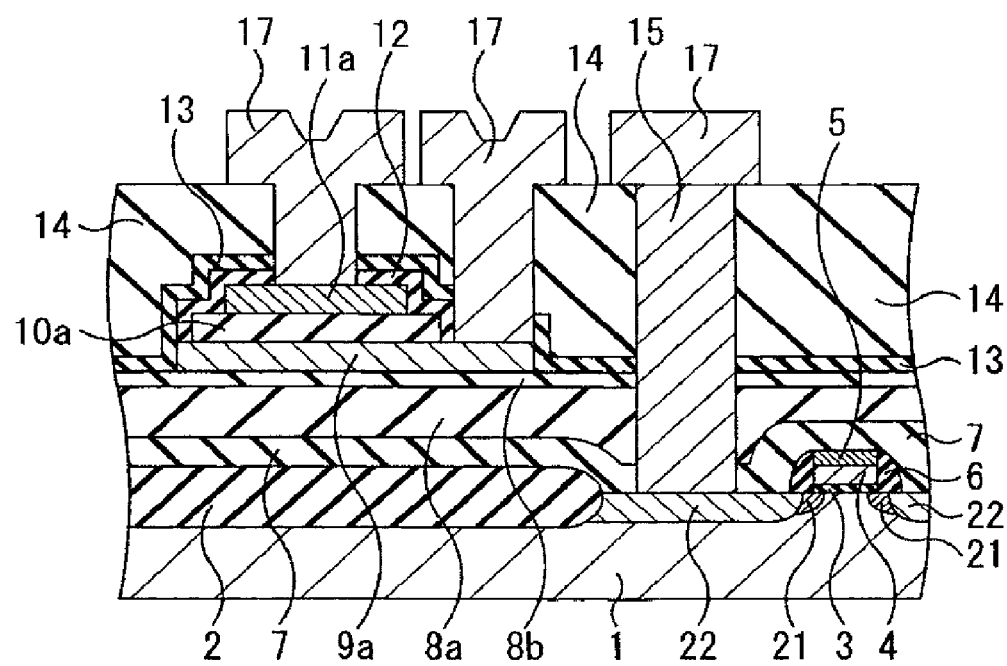

Subsequently, as shown in FIG. 2M, the SiON film 16 is removed from the entire surface by etching back to expose the surface of the W plug 15. Next, as shown in FIG. 2N, an Al film is formed while a part of the surface of the upper electrode 11a, a part of the surface of the lower electrode 9a, and the surface of the W plug 15 are in the state of being exposed, and the Al film is patterned to form an Al wiring 17. Then, for instance, the W plug 15, and the upper electrode 11a or the lower electrode 9a are connected with each other with a part of the aluminum wiring 17.

Subsequently, further, the formation or so forth of an interlayer insulating film, a contact plug, and wirings for a second and following layers from the bottom are conducted. Finally, a cover film constituted, for example, of a TEOS oxide film and a SiN film is formed to complete the ferroelectric memory including the ferroelectric capacitor.

In the present embodiment, as described above, when forming the upper electrode 11a (the upper electrode film 11), the crystallized $IrO_x$ film 11b is formed on the ferroelectric film 10, and thereby the upper layer of the ferroelectric film 10 becomes difficult to react with the upper electrode film 11, so that generation of an interface layer is prevented. Accordingly, larger parts remain to be operative as a ferroelectric, so that sufficient polarization inversion amount $Q_{sw}$ can be obtained. Besides, the crystal growth to be a large crystal is prevented, so that hydrogen is difficult to diffuse even in the following thermal treatment under a reducing atmosphere, so that the ferroelectric film 10 is difficult to be reduced. Hence, favorable characteristics can be obtained.

Briefly, according to the above-described embodiment, the interface between an upper electrode and a ferroelectric film can be improved, and also degradation in the process can be improved. As the result, polarization inversion amount can be improved, thereby coercive voltage can be reduced, and fatigue tolerance and imprint resistance can be improved. Such a ferroelectric capacitor is exceedingly suitable for a ferroelectric memory of the future generation operating at low voltage.

Figure 5C:
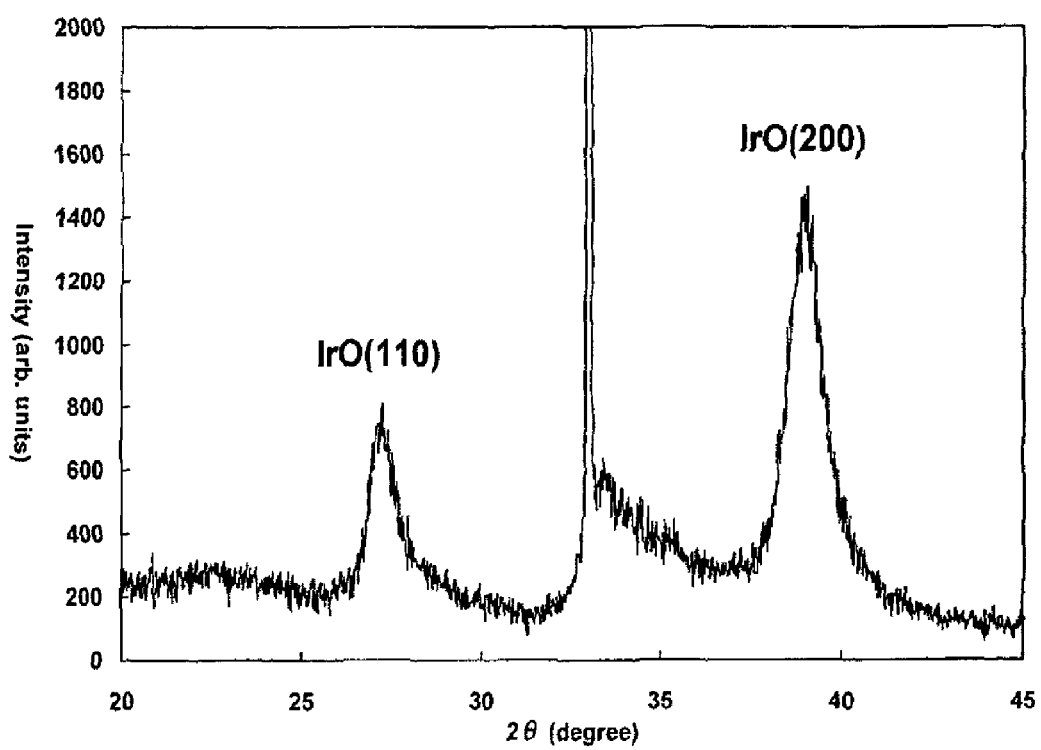
FIG. 5C is a graph showing an orientation of an $IrO_x$ film.

Incidentally, FIG. 5A to FIG. 5C are the results of observing the orientation of the $IrO_x$ film 11b by X-ray diffraction, in which a solid line in FIG. 5A and FIG. 5C show the orientation of the $IrO_x$ film 11b, and a dotted line in FIG. 5A and FIG. 5B show the orientation of an initial layer of the upper electrode formed by the conventional method. As shown in FIG. 5A to FIG. 5C, the initial layer formed by the conventional method is oriented slightly toward a (110) plane only, whereas the $IrO_x$ film 11b is oriented toward the (110) plane and a (200) plane strongly. Thus, there is a substantial difference between the conventional manufacturing method and the manufacturing method of the present invention in the orientation of the initial layer of the upper electrode film.

Next, description will be given for the results of experimental tests actually conducted by the present inventor.

-First Test-

Figure 6A:
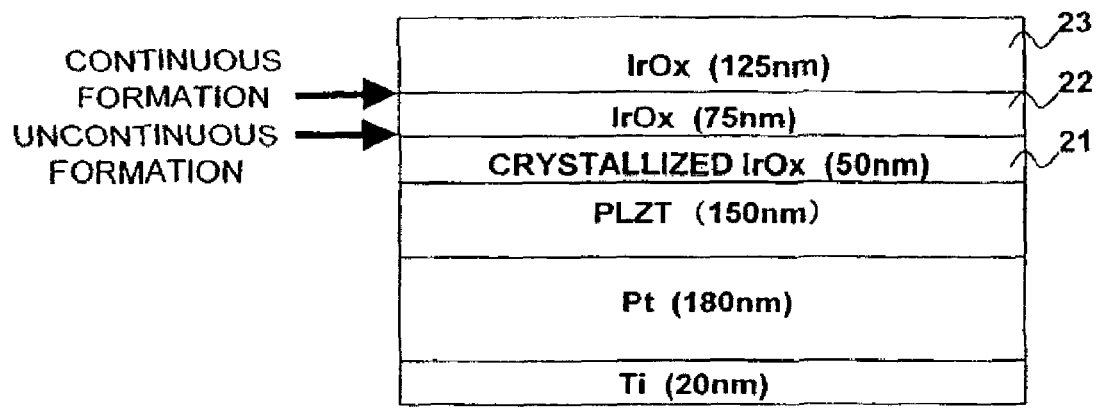
FIG. 6A is a cross sectional view showing a method for manufacturing a ferroelectric capacitor according to an embodiment.
Figure 6B:
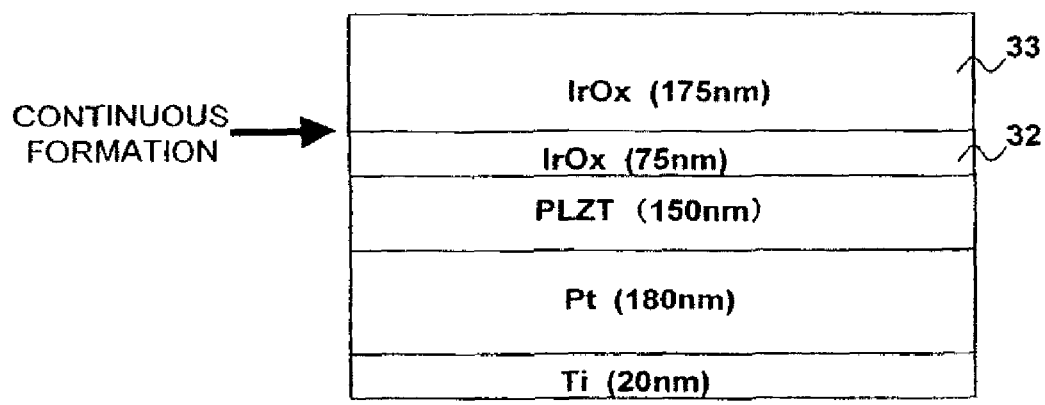
FIG. 6B is a cross sectional view showing an method for manufacturing a ferroelectric capacitor according to a conventional example.

In the first test, a square ferroelectric capacitors (discrete) having a side of 50 μm was formed by two kinds of methods (embodiment, conventional example) and measurements were made to obtain their polarization inversion amounts $Q_{sw}$. As a ferroelectric film, PLZT films (thickness: 120 nm, 150 nm) containing 1.5 mol % of lanthanum were formed. In the embodiment, as shown in FIG. 6A, when forming the upper electrode, a crystallized $IrO_x$ film 21 was formed by sputtering and thereafter two kinds of $IrO_x$ films 22 and 23 were formed successively by sputtering. The deposition temperature for forming the $IrO_x$ film 21 was set at 300° C. and the thickness of the $IrO_x$ film 21 was set to 50 nm. Meanwhile, the deposition temperature for forming the $IrO_x$ film 22 was set at 20° C., the sputtering power therefor was set to 1 kW, and the thickness of the $IrO_x$ film 22 was set to 75 nm. The deposition temperature for forming the $IrO_x$ film 23 was set at 20° C., the sputtering power therefor was set to 2 kW, and the thickness of the $IrO_x$ film 23 was set to 125 nm. On the other hand, in the comparison example, as shown in FIG. 6B, when forming the upper electrode, two kinds of $IrO_x$ films 32 and 33 were formed successively directly on the PLZT film by sputtering without forming the crystallized IrOx film 21. The deposition temperature for forming the $IrO_x$ film 32 was set at 20° C., the sputtering power therefor was set to 1 kW, and the thickness of the $IrO_x$ film 32 was set to 75 nm. The deposition temperature for forming the $IrO_x$ film 33 was set at 20° C., the sputtering power therefor was set to 2 kW, and the thickness of the $IrO_x$ film 33 was set to 175 nm.

Figure 7:
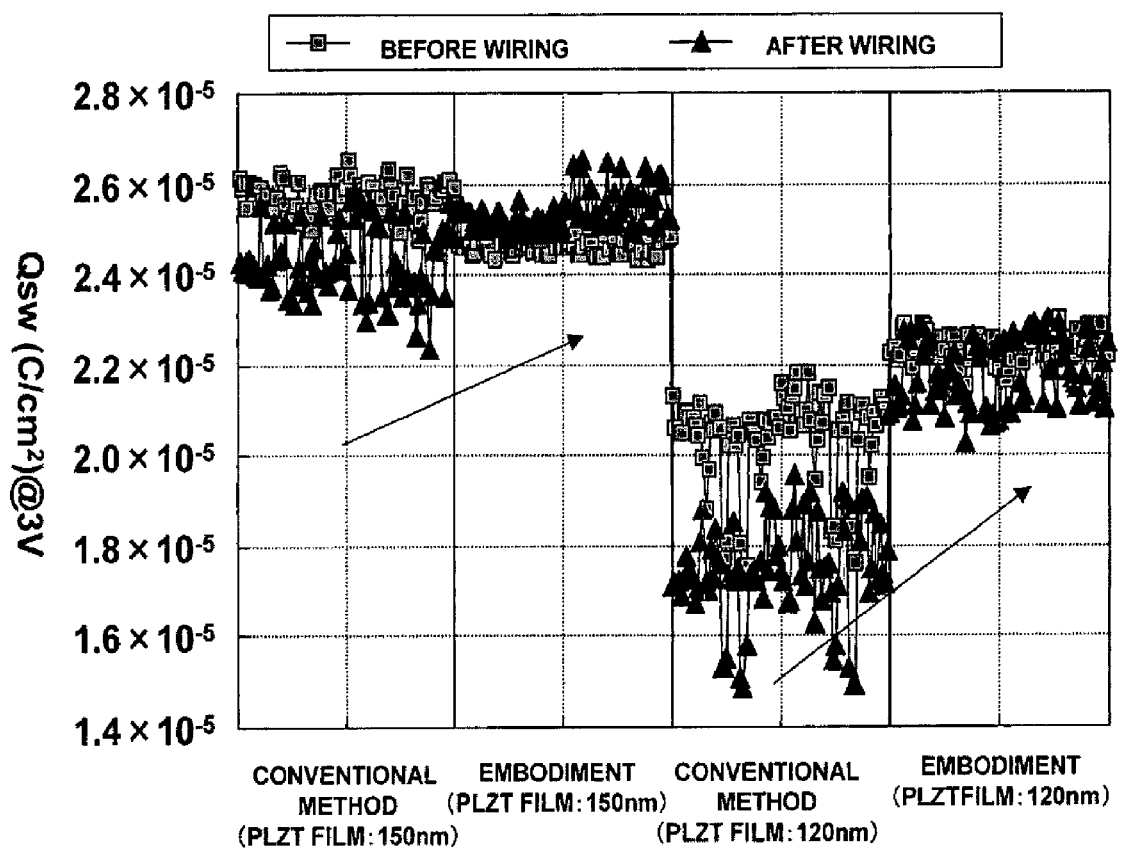
FIG. 7 is a graph showing a result of a first test.

FIG. 7 shows the measurement results of the polarization inversion amounts $Q_{sw}$ when the applied voltage was set at 3.0 V, in which ▲ indicates the result of the measurement made after forming a wiring on the upper electrode, and ■ indicates the result of the measurement made before such a wiring formation. As shown in FIG. 7, the comparison between the embodiment and the comparison example shows that the variation in the polarization inversion amount caused depending on presence or absence of the wiring is reduced in the case of the embodiment without regard to the thickness of the PLZT film. This indicates that the embodiment is difficult to suffer damage when forming the wiring.

-Second Test-

In the second test, 1428 pieces of ferroelectric capacitors (cell capacitor) each having a planar shape of rectangle with a long side of 1.60 μm and a short side of 1.15 μm were formed by two kinds of methods (embodiment, conventional example) and measurements were made to obtain their polarization inversion amounts $Q_{sw}$. Respective samples were formed in the same manner as in the first test.

Figure 8:
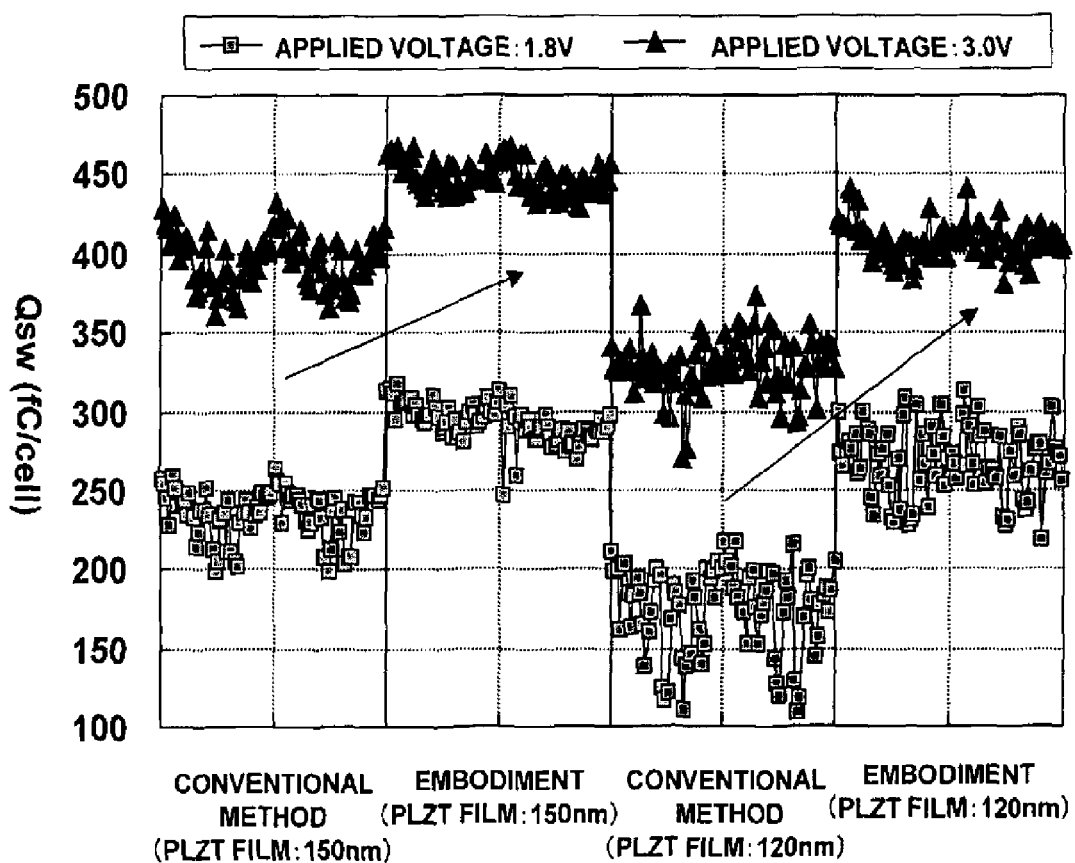
FIG. 8 is a graph showing a result of a second test.

FIG. 8 shows resultant polarization inversion amounts $Q_{sw}$ of the measurement at an applied voltage of 1.8 V or 3.0 V. FIG. 8 shows the result of the measurement (average) made after the formation of the wiring on the upper electrode. As shown in FIG. 8, in the case of the embodiment, higher polarization inversion amounts $Q_{sw}$ could be obtained without regard to the thickness of the PLZT film.

-Third Test-

In the third test, the ferroelectric capacitors (cell capacitor) similar to those in the second test were formed by two kinds of methods (embodiment, conventional example) and measurements were made to obtain their coercive voltages Vc. Also, here, the applied voltage at the time when the value P has the largest variation ratio with respect to the variation in the applied voltage is defined as the coercive voltage Vc.

Figure 9:
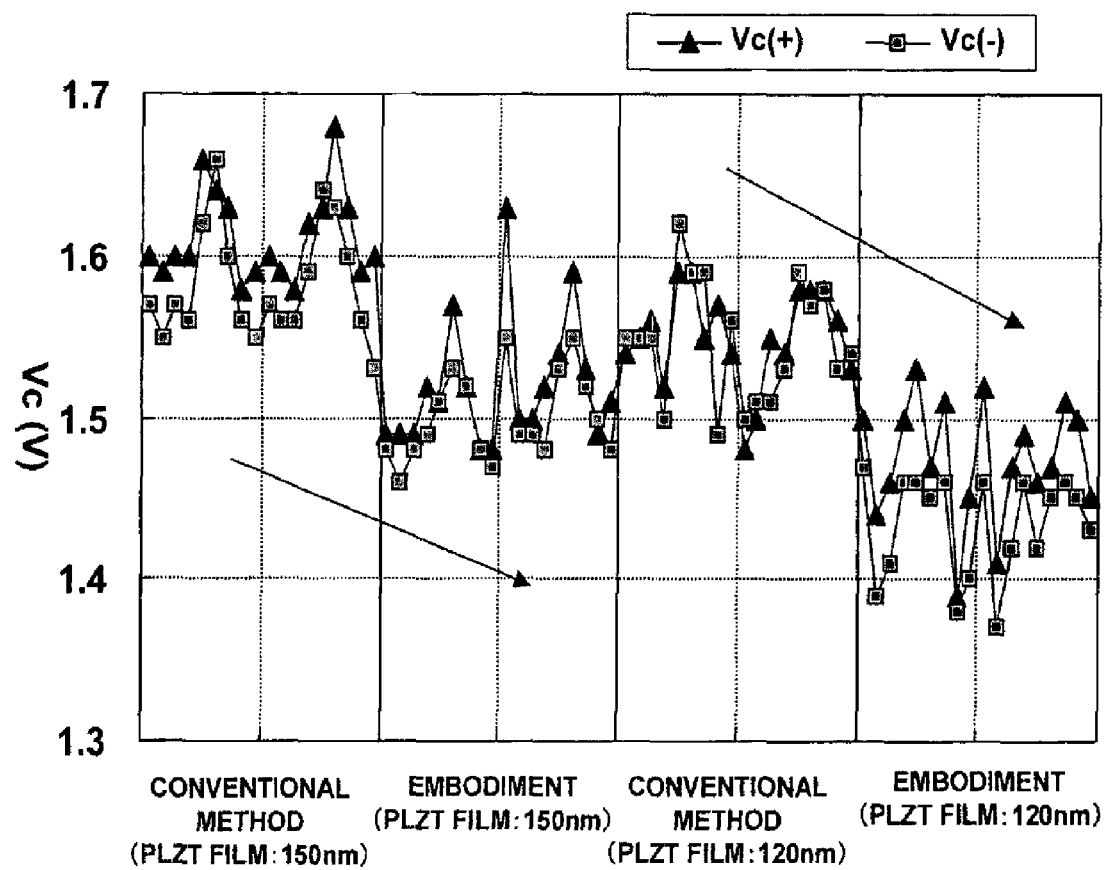
FIG. 9 is a graph showing a result of a third test.

The measurement result of the coercive voltages Vc is shown in FIG. 9. Note that ■ indicates the coercive voltage Vc (−) in the case of the negative variation ratio, and ▲ indicates the coercive voltage Vc (+) in the case of the positive variation ratio. As shown in FIG. 9, in the case of the embodiment, lower coercive voltages Vc could be obtained without regard to the thickness of the PLZT film. In addition, as the PLZT film becomes thinner, the lower coercive voltages Vc could be obtained -Fourth Test- In the fourth test, the ferroelectric capacitors (cell capacitor) similar to those in the second test were formed by two kinds of methods (embodiment, conventional example) to obtain the relations between the applied voltages and the polarization inversion amounts $Q_{sw}$.

Figure 10:
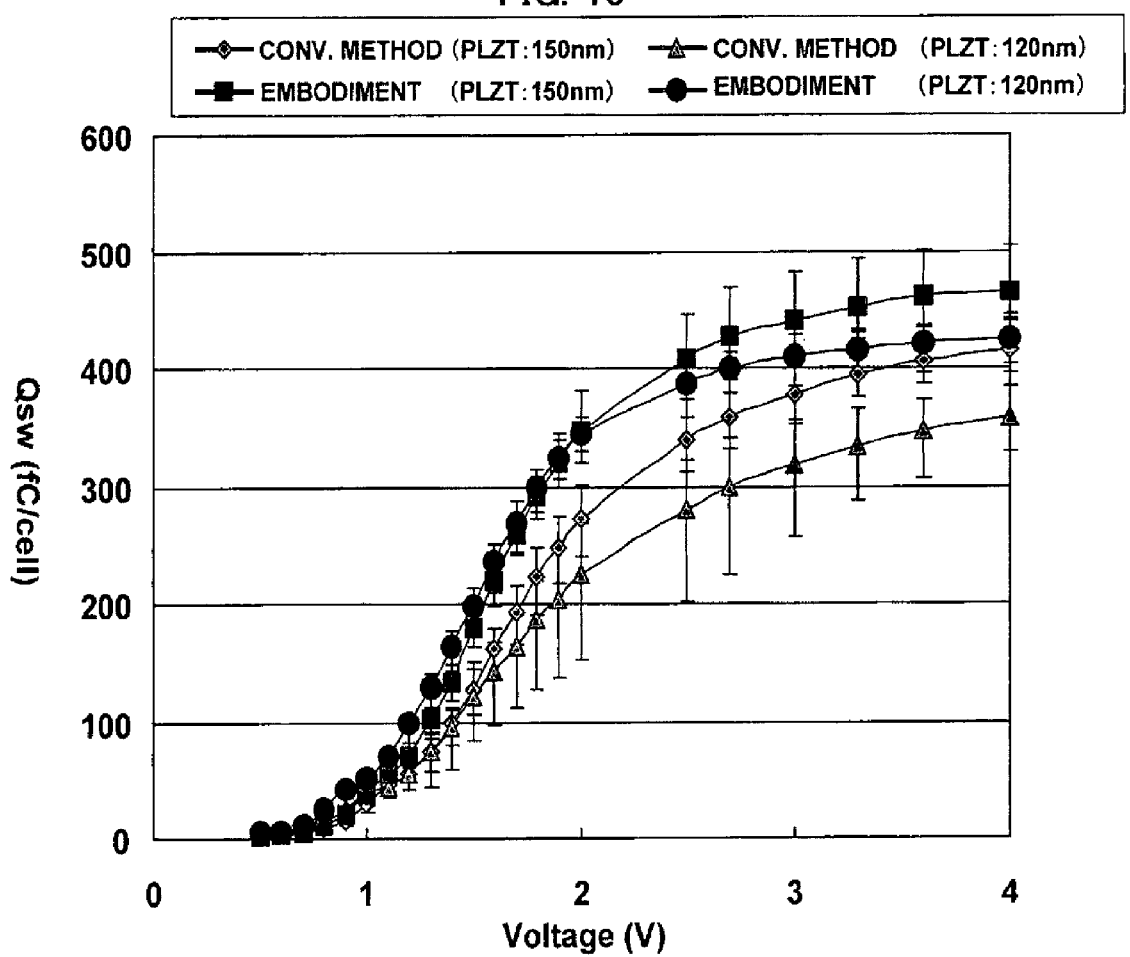
FIG. 10 is a graph showing a result of a fourth test.

The relations are shown in FIG. 10. As shown in FIG. 10, in the case of the embodiment, higher polarization inversion amounts $Q_{sw}$ could be obtained over a low voltage to a saturation voltage, and slopes thereof became large, without regard to the thickness of the PLZT film. This means that the embodiment is excessively suitable for the ferroelectric memory operative at low voltage.

-Fifth Test-

In the fifth test, the ferroelectric capacitors (cell capacitor) similar to those in the second test were formed by two kinds of methods (embodiment, conventional example) and a research was made to check their fatigue losses (stress cycle dependencies).

Figure 11:
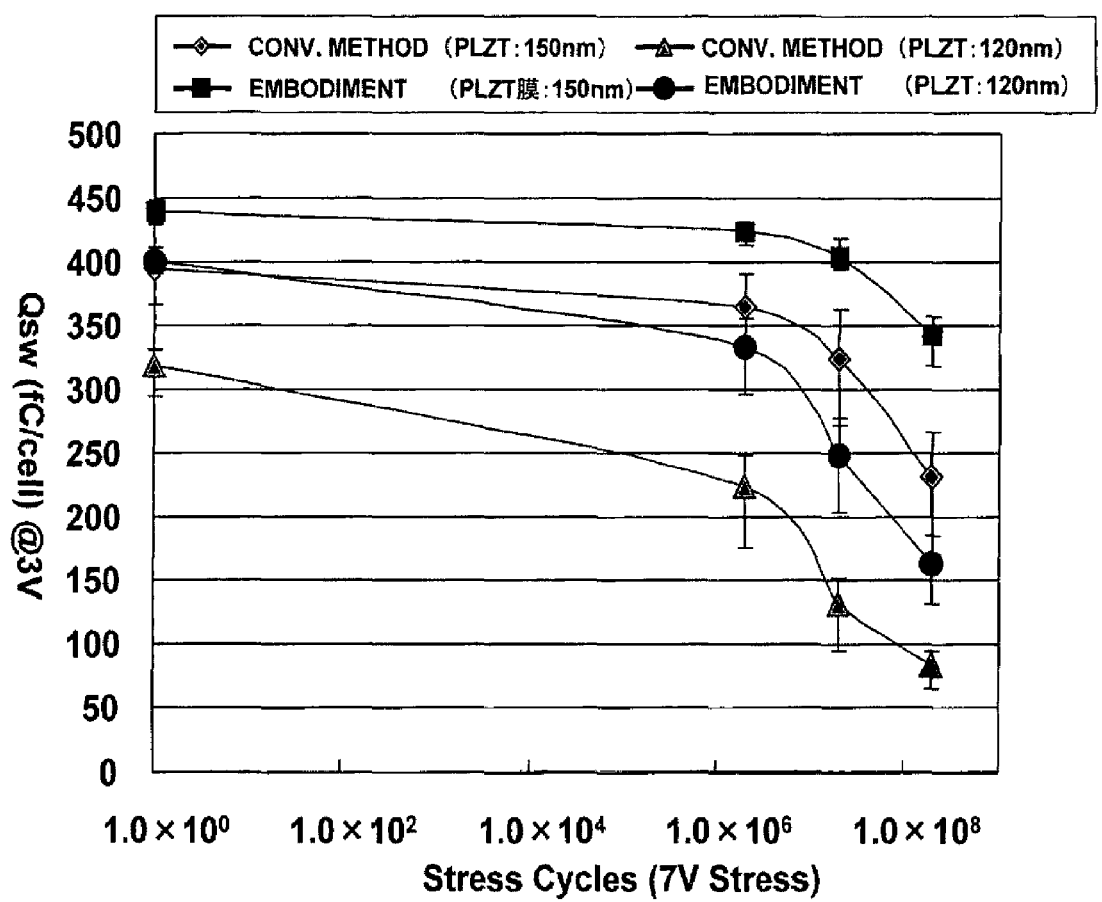
FIG. 11 is a graph showing a result of a fifth test.

Here, a readout voltage was set to 3V, and a stress voltage was set to 7V. FIG. 11 shows the result. As shown in FIG. 11, the polarization inversion amounts $Q_{sw}$ at $2 \times 10^8$ cycle were 342 fC/cell in the case of the PLZT film of the embodiment having a thickness of 150 nm, 163 fC/cell in the case of the PLZT film of the embodiment having a thickness of 120 nm, 232 fC/cell in the case of the PLZT film of the conventional example having a thickness of 150 nm, and 83 fC/cell in the case of the PLZT film of the conventional example having a thickness of 120 nm. Specifically, for the PLZT film of the embodiment having a thickness of 150 nm, the fatigue loss on the basis of the initial value was 22%, and for the PLZT film of the embodiment having a thickness of 120 nm, the fatigue loss on the basis of the initial value was 59%. Meanwhile, for the PLZT film of the conventional example having a thickness of 150 nm, the fatigue loss on the basis of the initial value was 41%, and for the PLZT film of the conventional example having a thickness of 120 nm, the fatigue loss on the basis of the initial value was 74%. Hence, it can be said that fatigue loss is difficult to be caused in the embodiment.

-Sixth Test-

In the sixth test, ferroelectric capacitors (cell capacitor) similar to those in the second test were formed by two kinds of methods (embodiment, conventional example) and a research was made to evaluate imprint characteristics thereof. Here, the imprint characteristics were evaluated by OS_RATE. The OS_RATE indicates difficulty of imprinting the more, the smaller its absolute value is.

Figure 12:
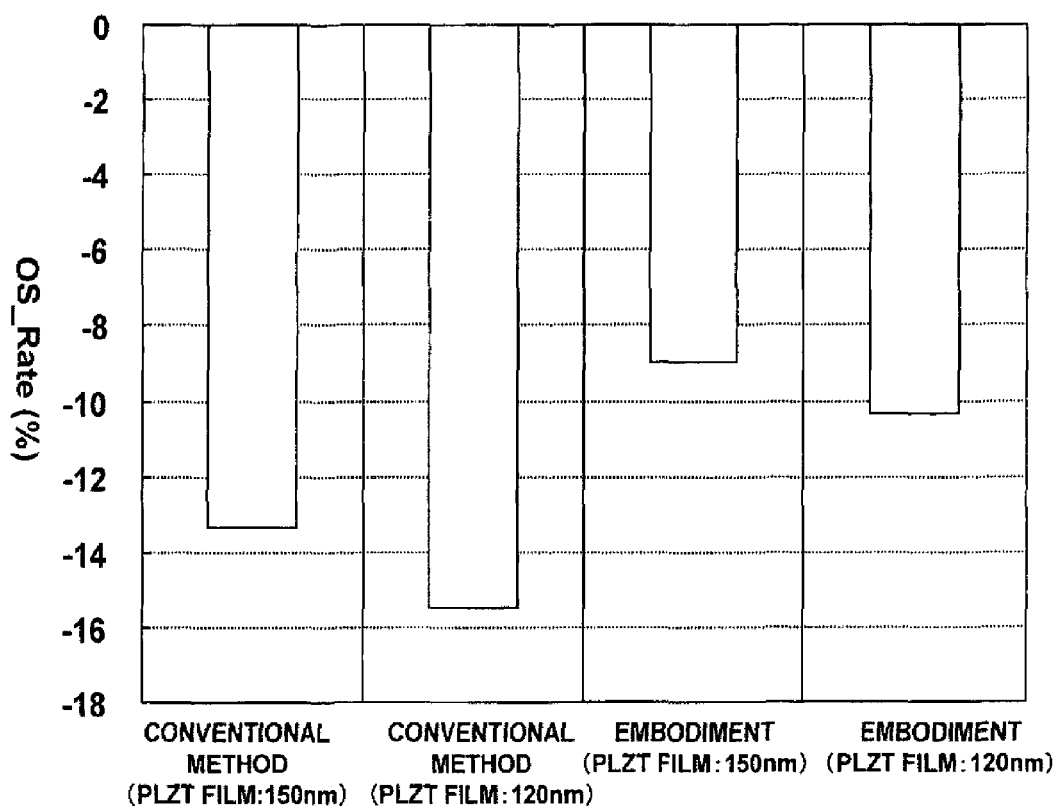
FIG. 12 is a graph showing a result of a sixth test.

FIG. 12 shows the result. In FIG. 12, the worst value is presented for each sample. As shown in FIG. 12, the result obtained from the embodiment is better than that of the comparison example by about 40%.

-Seventh Test-

In the seventh test, a thermally-oxidized film having a thickness of 100 nm was grown on a silicon substrate in a diffusion furnace, and an $IrO_x$ film was formed thereon under various conditions to evaluate its crystallinity. In the crystallinity evaluation, an analysis by an X-ray diffraction was conducted.

Figure 13A:
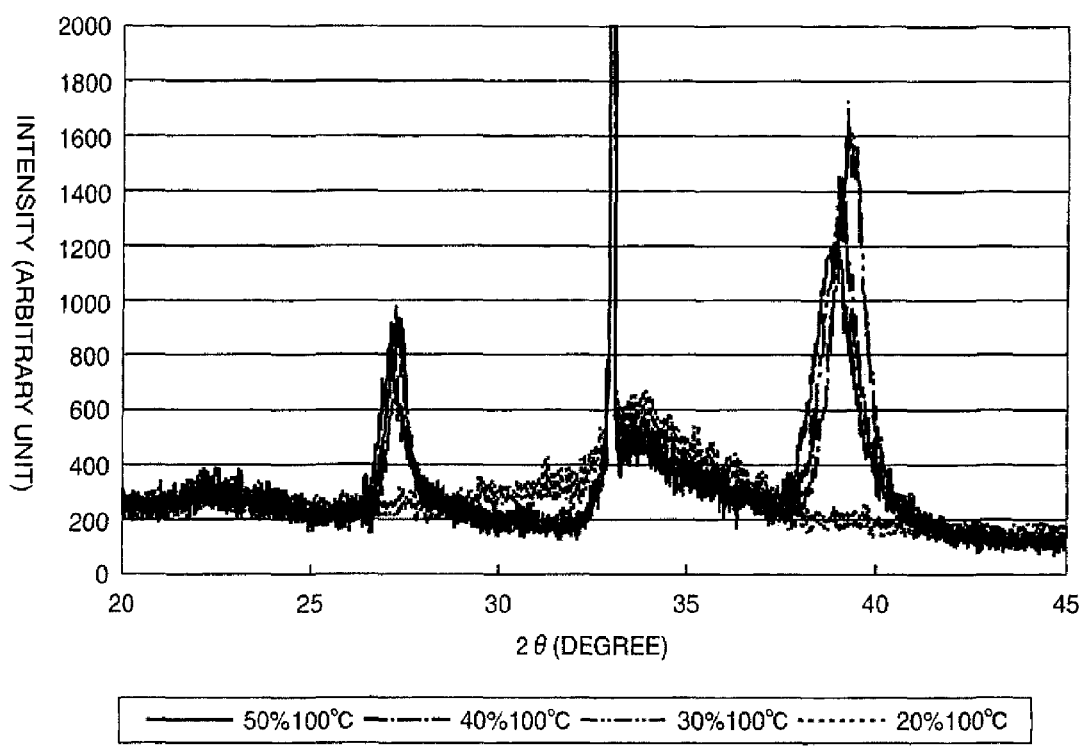
FIG. 13A is a graph showing results of a seventh test (100° C.)
Figure 13B:
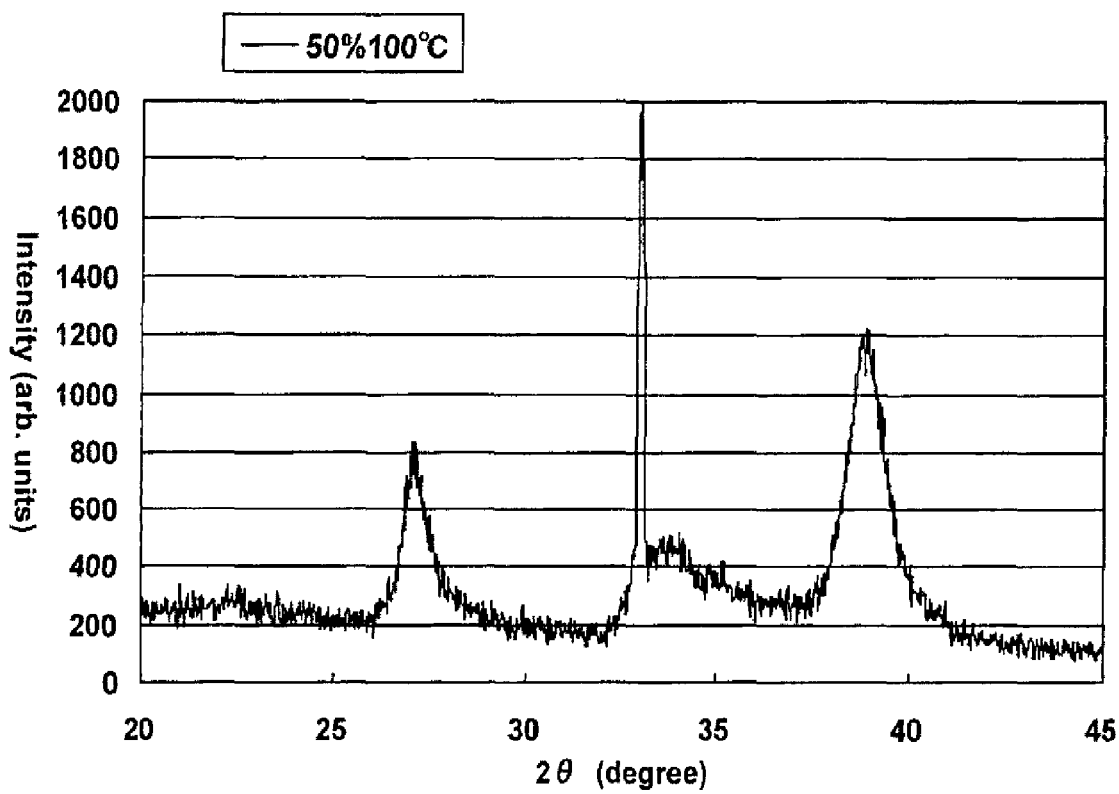
FIG. 13B is a graph showing a result of the seventh test (50%, 100° C.)
Figure 13C:
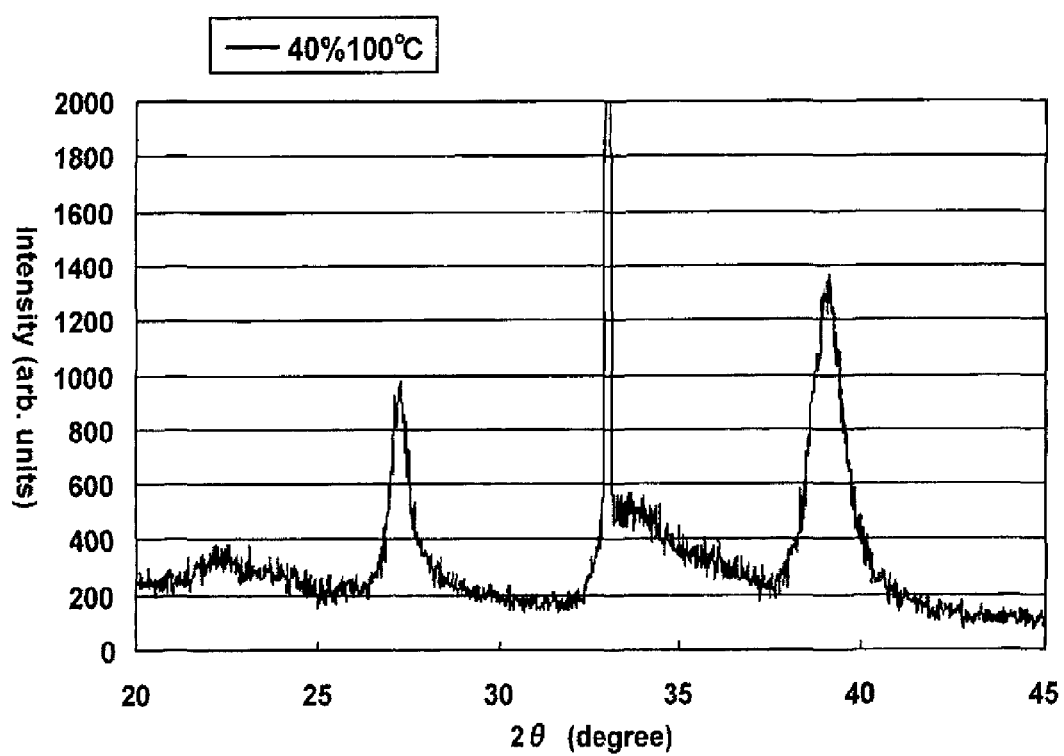
FIG. 13C is a graph showing a result of the seventh test (40%, 100° C.)
Figure 13D:
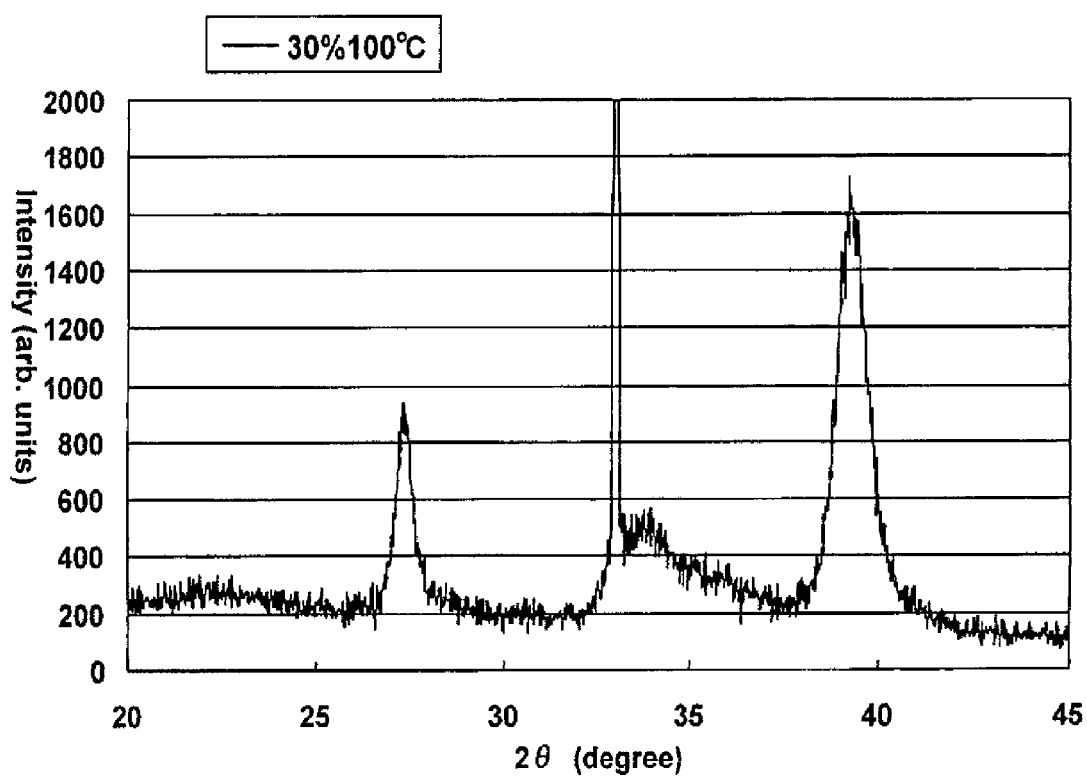
FIG. 13D is a graph showing a result of the seventh test (30%, 100° C.)
Figure 13E:
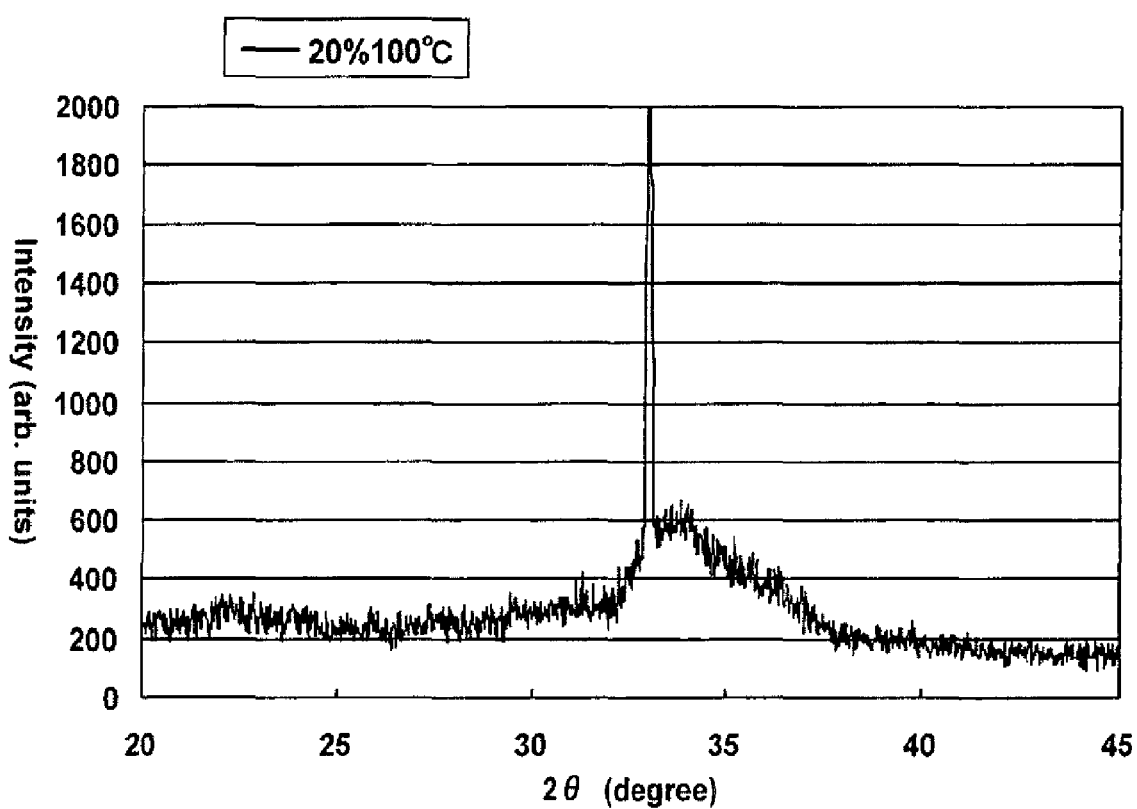
FIG. 13E is a graph showing a result of the seventh test (20%, 100° C.)
Figure 13F:
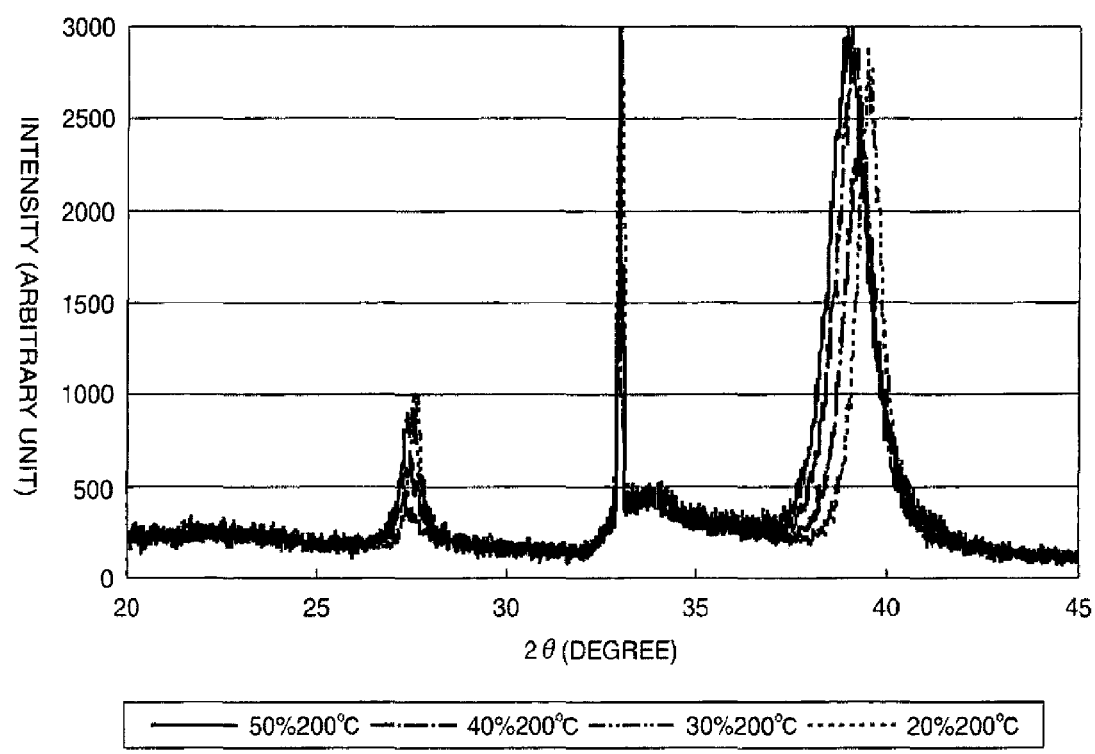
FIG. 13F is a graph showing results of the seventh test (200° C.)
Figure 13G:
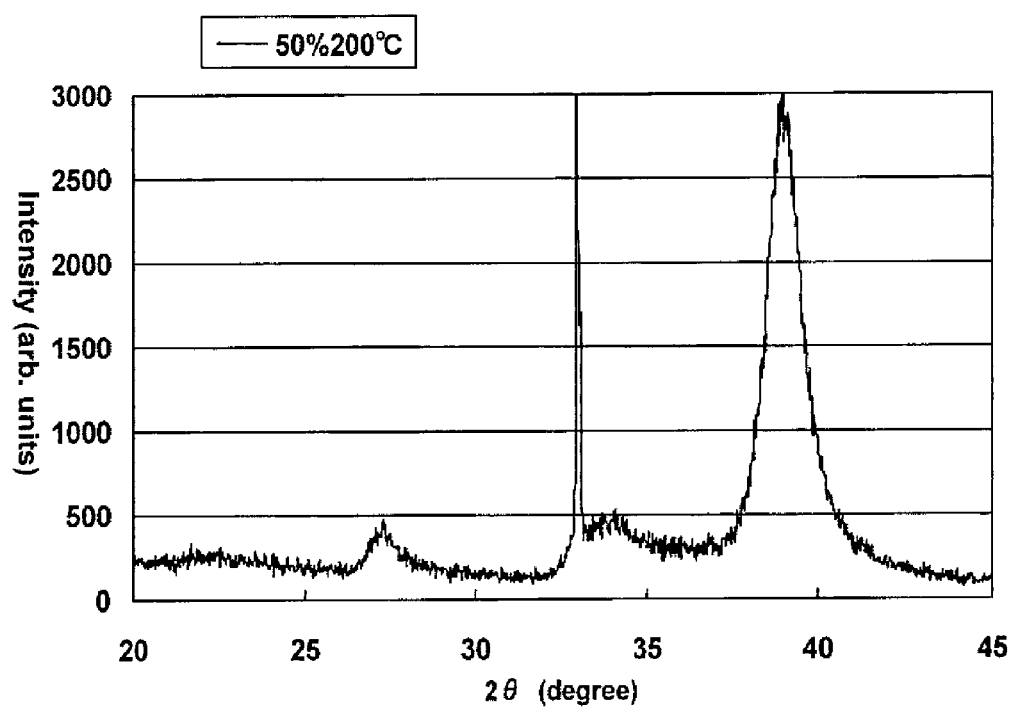
FIG. 13G is a graph showing a result of the seventh test (50%, 200° C.)
Figure 13H:
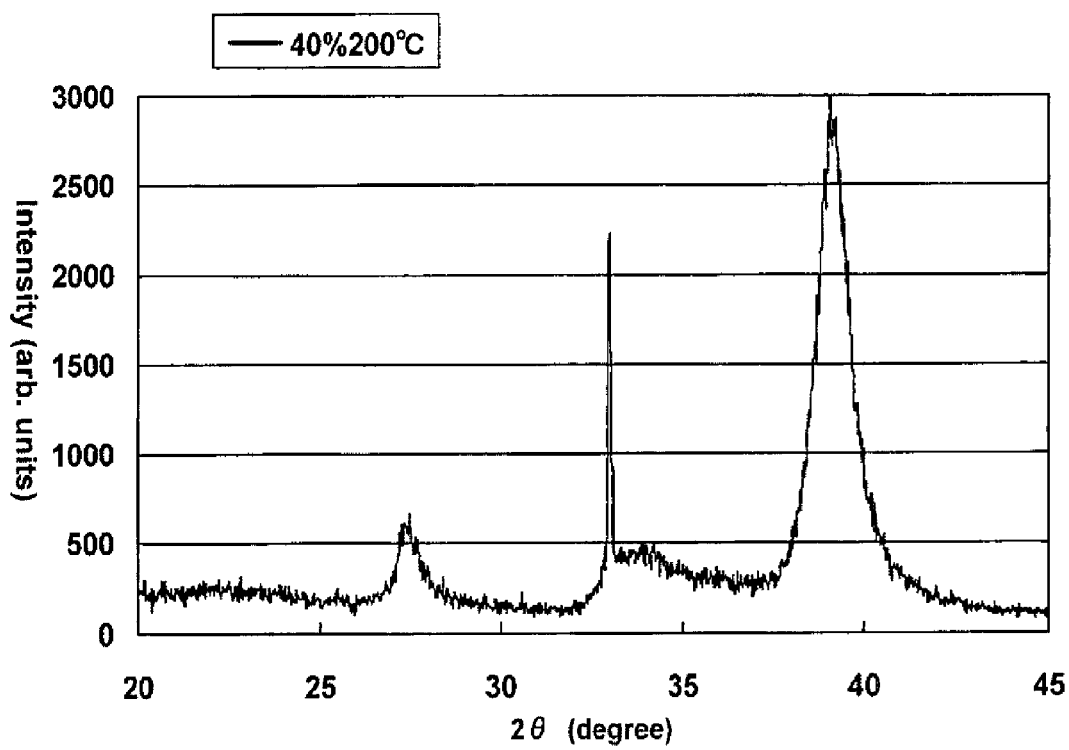
FIG. 13H is a graph showing a result of the seventh test (40%, 200° C.)
Figure 13I:
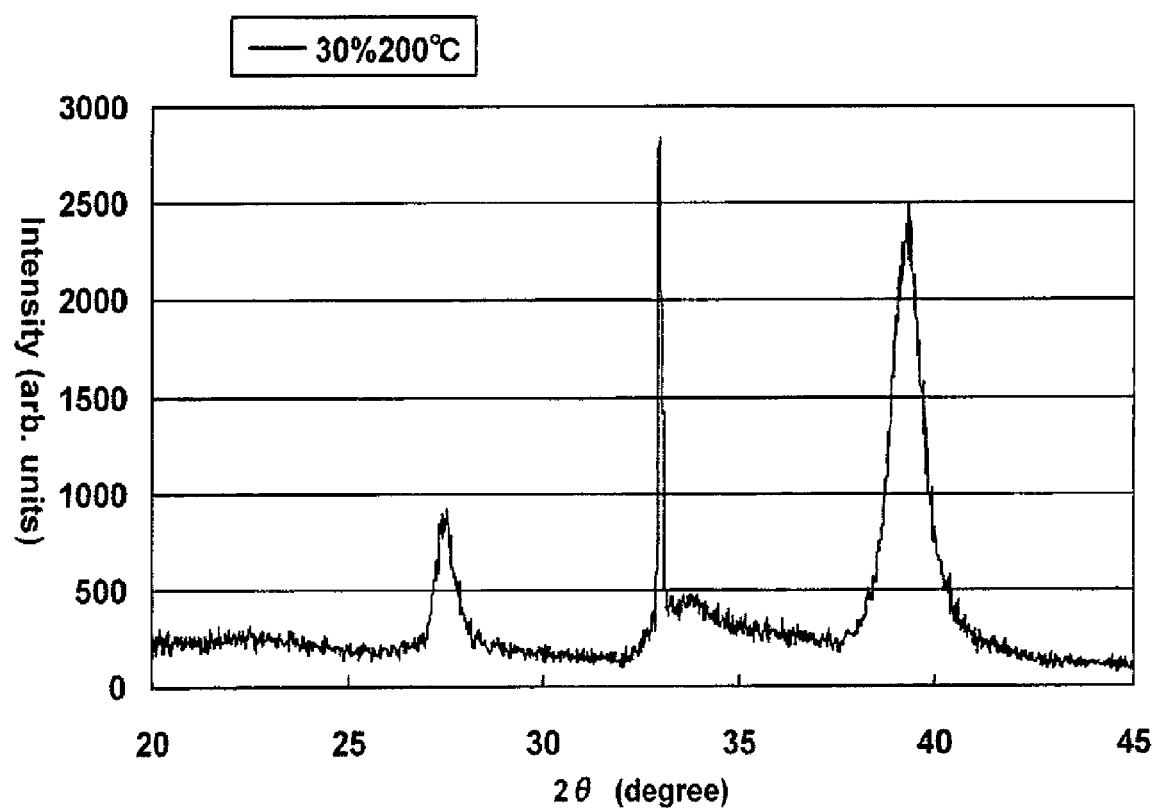
FIG. 13I is a graph showing a result of the seventh test (30%, 200° C.)
Figure 13J:
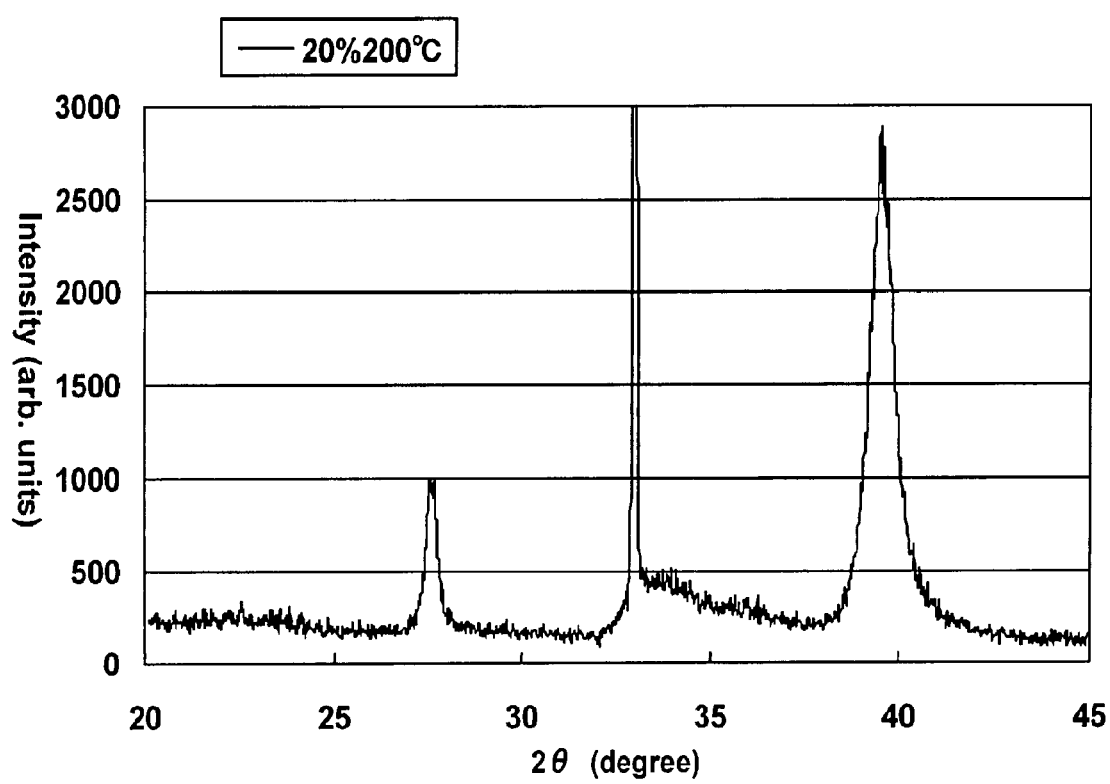
FIG. 13J is a graph showing a result of the seventh test (20%, 200° C.)
Figure 13K:
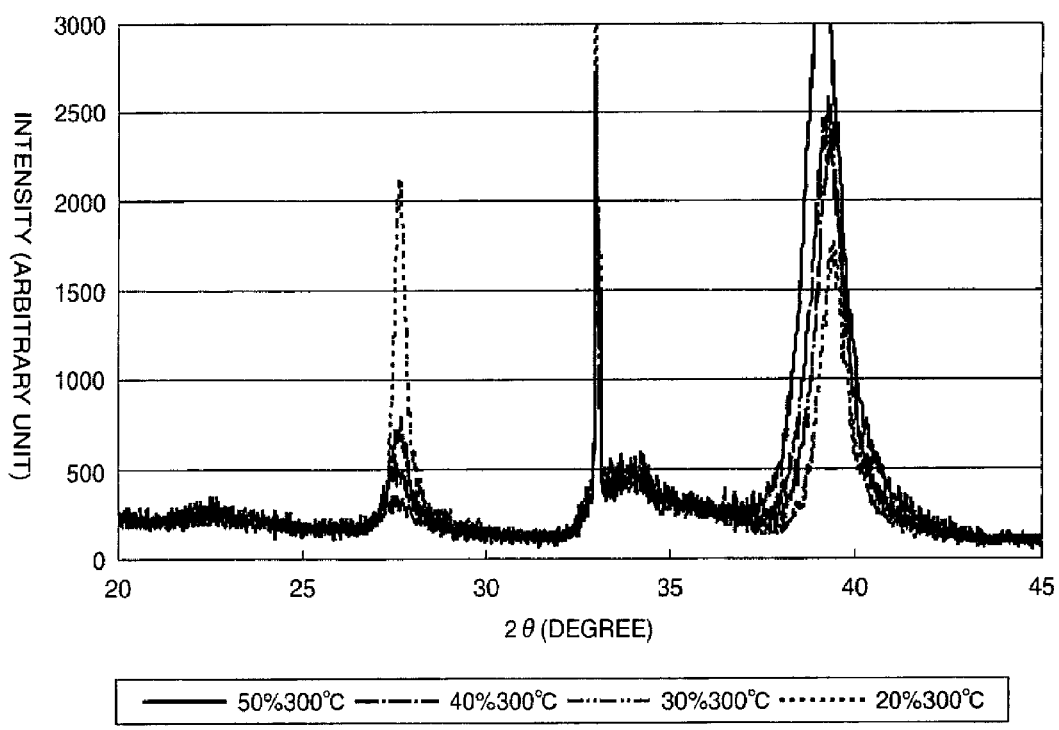
FIG. 13K is a graph showing results of the seventh test (300° C.)
Figure 13L:
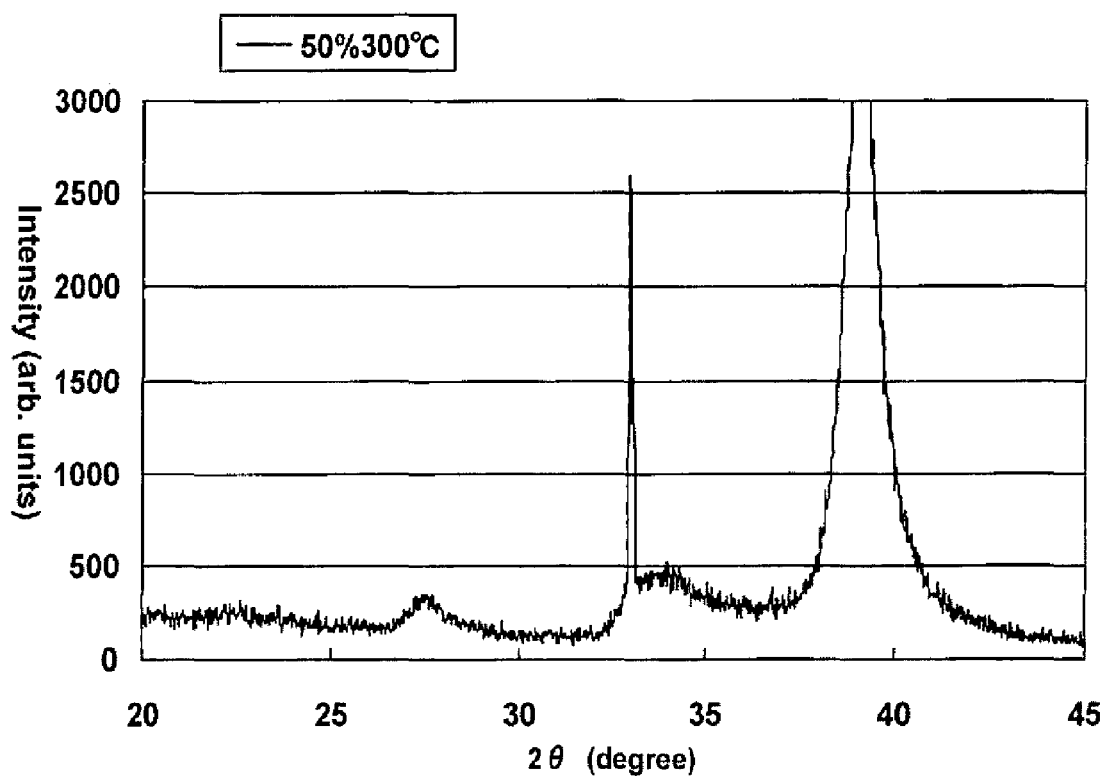
FIG. 13L is a graph showing a result of the seventh test (50%, 300° C.)
Figure 13M:
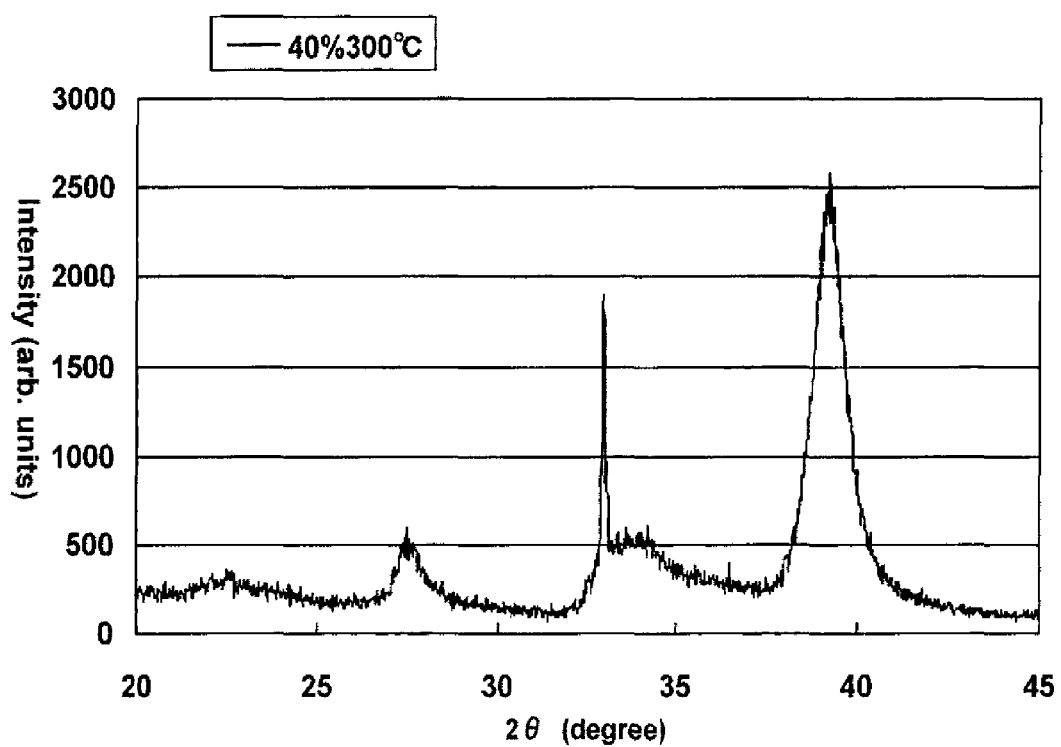
FIG. 13M is a graph showing a result of the seventh test (40%, 300° C.)
Figure 13N:
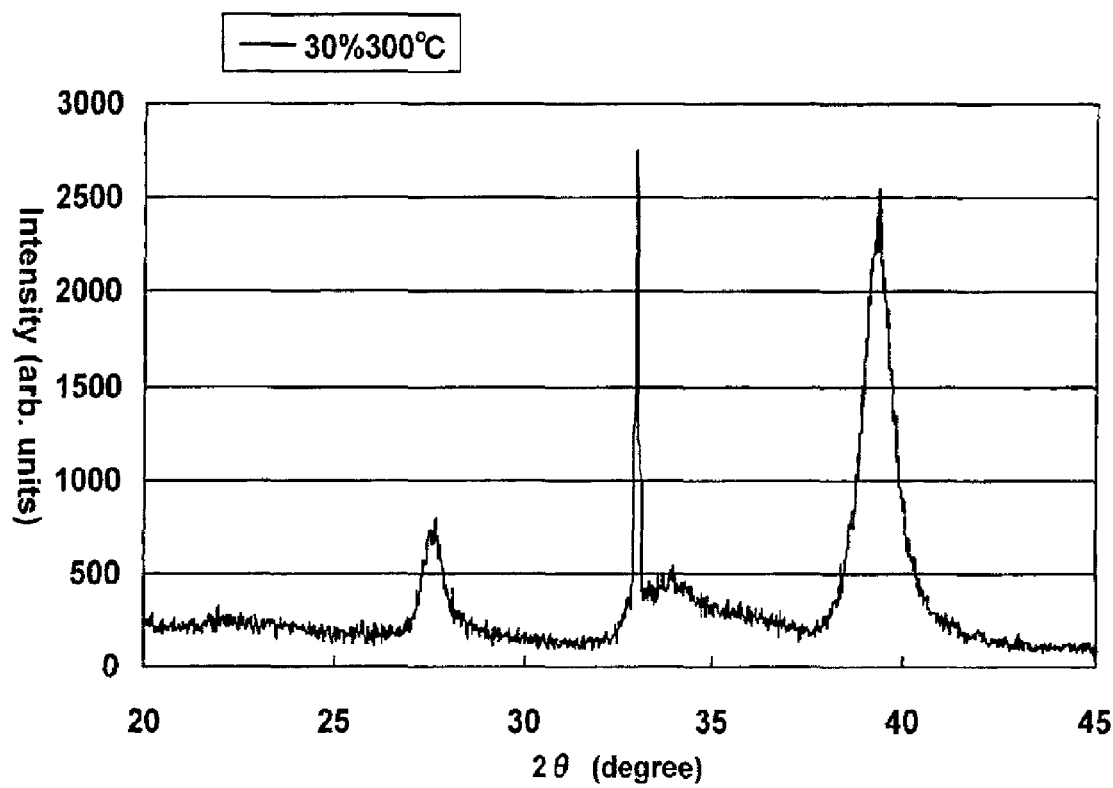
FIG. 13N is a graph showing a result of the seventh test (30%, 300° C.)
Figure 13O:
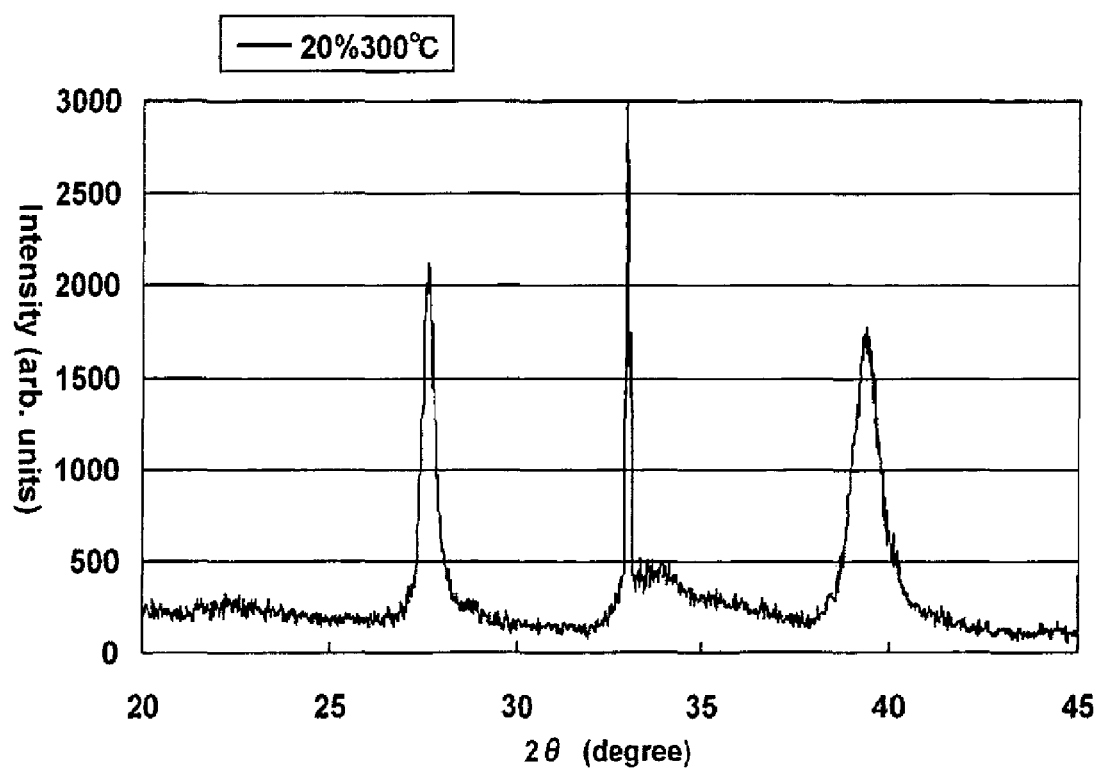
FIG. 13O is a graph showing a result of the seventh test (20%, 300° C.)

FIGS. 13A to 13O show the results. Each of percentages shown in explanatory notes in FIGS. 13A to 13O indicates the ratio of oxygen flow (oxygen flow ratio) to a film-forming gas ($O_2$ flow rate/(Ar flow rate+$O_2$ flow rate)), and each temperature is the deposition temperature. Note that FIGS. 13B to 13E respectively show four graphs shown together in FIG. 13A, FIGS. 13G to 13J respectively show four graphs shown together in FIG. 13F, and FIGS. 13L to 13O respectively show four graphs shown together in FIG. 13K. As shown in FIGS. 13A to 13O, as the oxygen flow rate lowers, a peak representing an $IrO_x$ (110) plane rises and, at the same time, a peak representing an $IrO_x$ (200) plane declines to approximate to an X-ray diffraction diagram showing an $IrO_x$ (111) plane. These results indicate that as the oxygen flow rate lowers, the $IrO_x$ approximates to a metal. Although not shown in the drawings, when the deposition temperature was set at a room temperature, the same result as that obtained at a deposition temperature of 100° C. was obtained.

Further, in the present invention, $IrO_x$ is required to be in a crystallized state after it is formed as a film. A crystallized $IrO_x$ tends to be oriented to the $IrO_x$ (200) plane and the $IrO_x$ (110) plane, so that determination whether or not the $IrO_x$ is crystallized can be made based on the X-ray diffraction diagram. Further, a smaller crystal grain is preferable. As shown in FIGS. 13A to 13O, it is found that the adjustment of the deposition conditions for forming the $IrO_x$ film allows the $IrO_x$ film to be formed in the crystallized state. It should be noted that, in the case of the deposition temperature of 100° C., when the ratio of oxygen flow is set to 20%, the $IrO_x$ was scarcely crystallized to be almost in an amorphous state. Accordingly, the condition: deposition temperature: 100° C., oxygen flow ratio: 20%, can be said to be undesirable.

-Eighth Test-

In the eighth test, ferroelectric capacitors (discrete) similar to that in the first test were formed. At that time, when forming the upper electrode, the $IrO_x$ film was formed directly on the ferroelectric film under the same conditions as of the seventh test, and measurement were made for polarization inversion amounts $Q_{sw}$ of respective samples.

Figure 14:
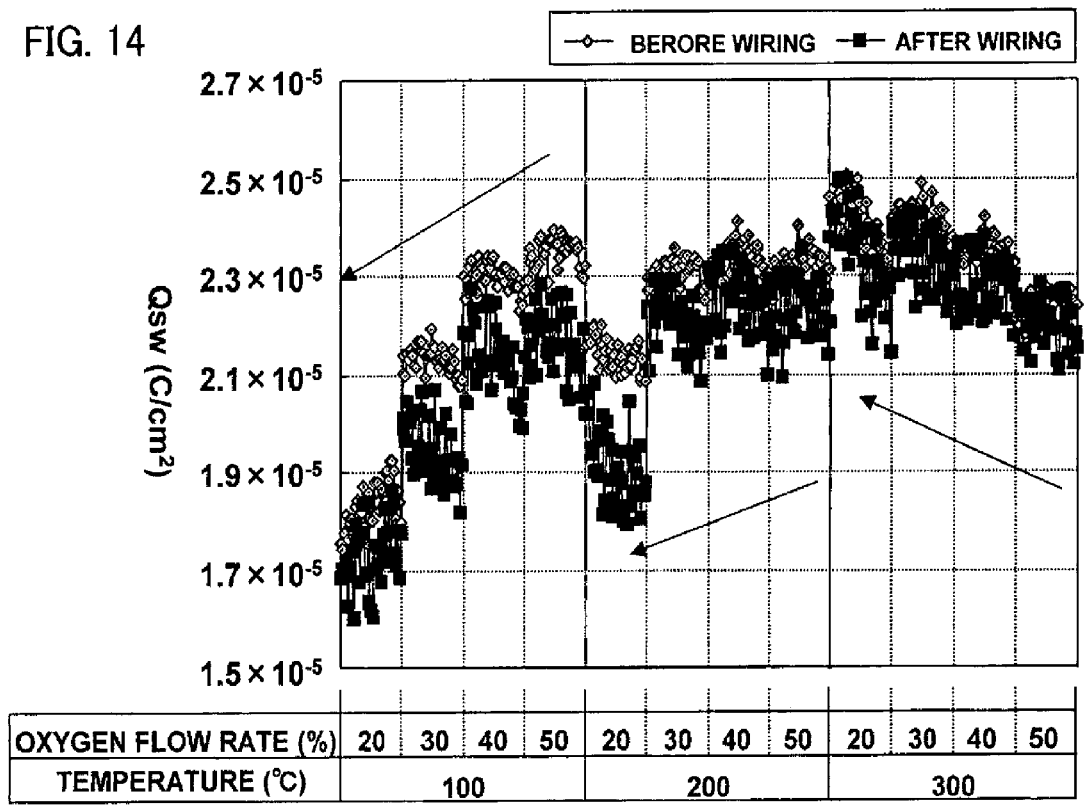
FIG. 14 is a graph showing a result of an eighth test.

FIG. 14 shows the results. As shown in FIG. 14, in the case of the deposition temperature of 100° C. or 200° C., when the oxygen flow ratio lowered, the polarization inversion amounts $Q_{sw}$ declined. Although not shown in the drawing, the same phenomenon was seen when the film is formed at a room temperature (50° C.). Meanwhile, in the case of the deposition temperature of 300° C., when the oxygen flow ratio lowered, the polarization inversion amount $Q_{sw}$ increased. The variations in accordance with the deposition temperatures as described above can be considered due to the differences in crystallinity of the formed $IrO_x$ films. Further, as the deposition temperature increased, the polarization inversion amount $Q_{sw}$ increased. Based on the result shown in FIG. 14, in order to obtain a larger polarization inversion amount $Q_{sw}$, it is possible to say that the deposition temperature is preferably set at around 300° C., for example at 280° C. to 320° C., and the oxygen flow ratio is preferably set to 20% to 30%.

-Ninth Test-

In the ninth test, ferroelectric capacitors (cell capacitor) similar to those in the second test were formed. At that time, when forming the upper electrode, the $IrO_x$ film was formed directly on the ferroelectric film under the same conditions as of the seventh test, and measurements were made to obtain polarization inversion amounts $Q_{sw}$ in the same manner as in the eighth test.

Figure 15:
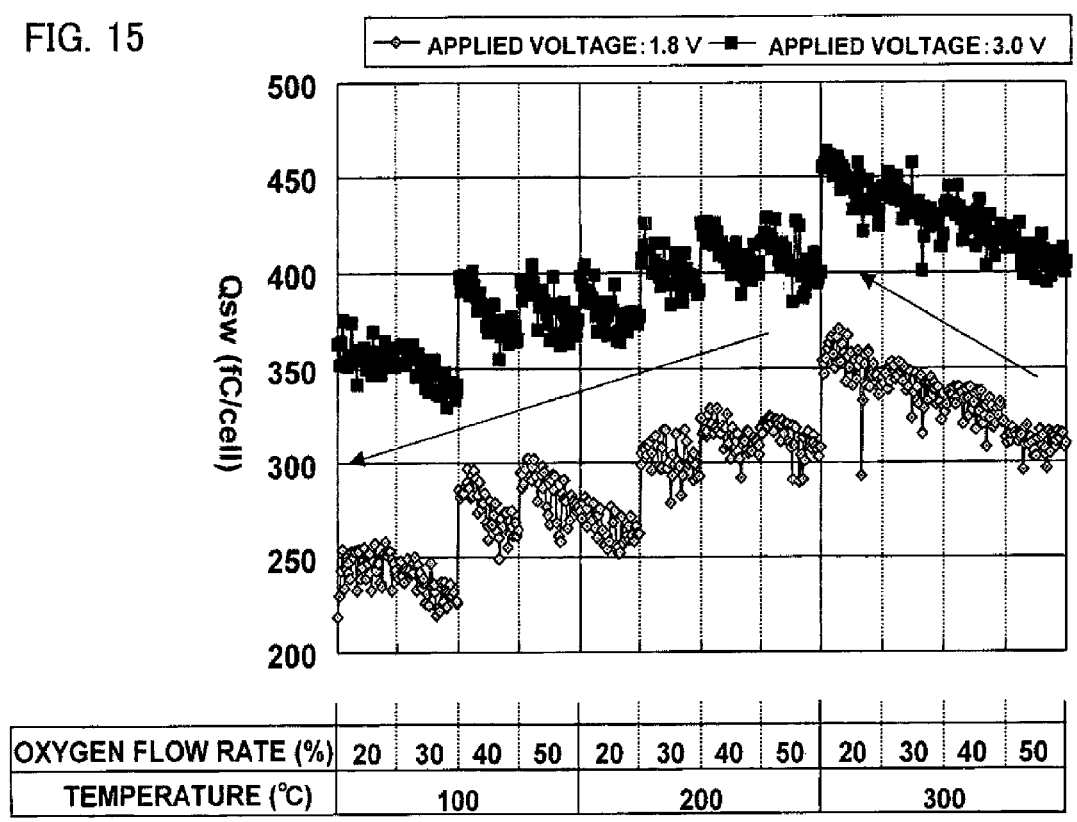
FIG. 15 is a graph showing a result of a ninth test.

FIG. 15 shows the results. As shown in FIG. 15, the same tendency as in the result shown in FIG. 14 was seen. Accordingly, also from the result shown in FIG. 15, it can be said that, in order to obtain higher polarization inversion amount $Q_{sw}$, the deposition temperature is preferably set at around 300° C., for example at 280° C. to 320° C., and the oxygen flow ratio is preferably set to 20% to 30%.

-Tenth Test-

In the tenth test, ferroelectric capacitors (cell capacitor) similar to those in the second test were formed. At that time, when forming the upper electrode, the $IrO_x$ film was formed directly on the ferroelectric film under the same conditions as of the seventh test, and measurement were made to obtain coercive voltages Vc of respective samples. Also, here, the applied voltage at the time when the value P has the largest variation ratio with respect to the variation in the applied voltage is defined as the coercive voltage Vc.

Figure 16:
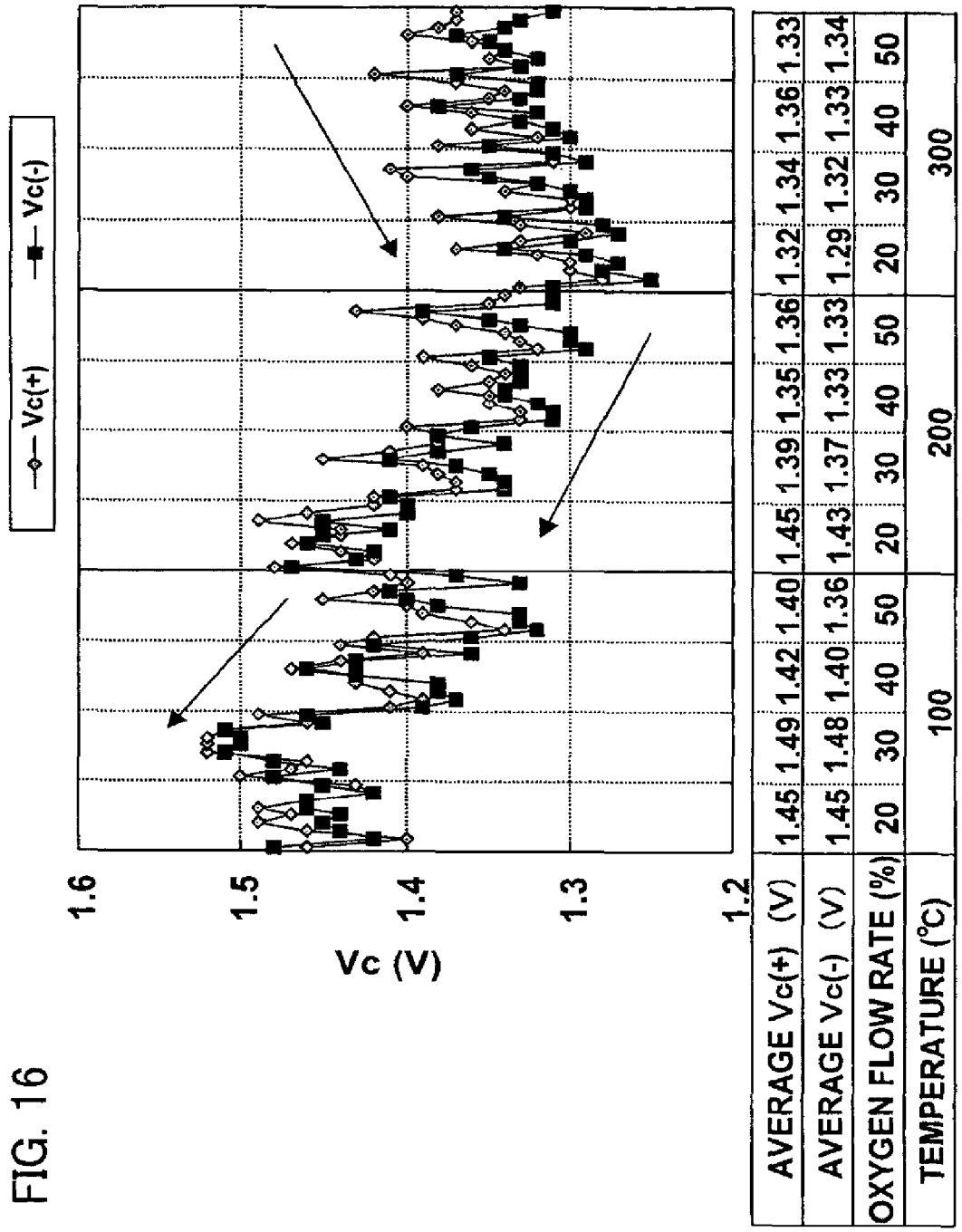
FIG. 16 is a graph showing a result of a tenth test.

FIG. 16 shows the result. Note that ■ indicates a coercive voltage Vc (−) when the variation ratio is negative, and ▲ indicates a coercive voltage Vc (+) when the variation ratio is positive. As shown in FIG. 16, in the case of the deposition temperature of 100° C. or 200° C., when the oxygen flow ratio lowered, the coercive voltage Vc increased. Meanwhile, in the case of the deposition temperature of 300° C., when the oxygen flow ratio lowered, the withstand Vc decreased. Hence, it is possible to consider that the tendency varies depending on the deposition temperature due to differences in crystallinity of the formed $IrO_x$ films. Further, the coercive voltage Vc decreased as the deposition temperature increased. From the result shown in FIG. 16, in order to obtain lower coercive voltage Vc, it can be said that the deposition temperature is preferably set at about 300° C., for example at 280° C. to 320° C., and the oxygen flow ratio is preferably set to 20% to 30%.

-Eleventh Test-

In the eleventh test, ferroelectric capacitors (discrete) similar to that in the first test were formed. At that time, when forming the upper electrode, the $IrO_x$ film was formed directly on the ferroelectric film under the same conditions as of the seventh test, and measurements were made to obtain leakage currents of respective samples.

Figure 17:
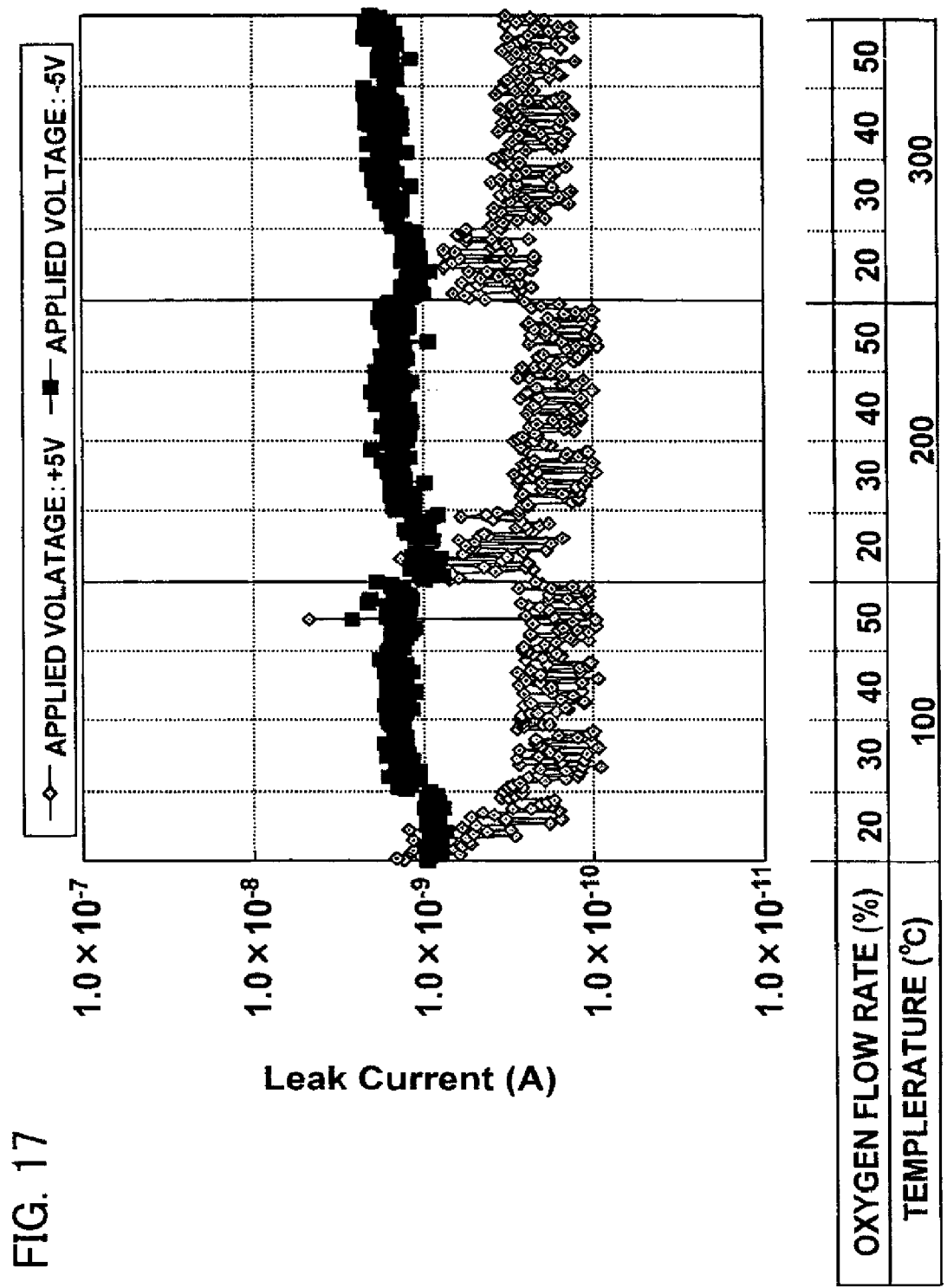
FIG. 17 is a graph showing a result of an eleventh test.

FIG. 17 shows the results. Note that the applied voltage is set to ±5V corresponding to the electric potential of the lower electrode on the basis that of the upper electrode. As shown in FIG. 17, the leakage current scarcely depended on the deposition temperature. Further, at the respective deposition temperatures, the differences between the positive and negative applied voltages decreased as the oxygen flow ratio lowered. From the result shown in FIG. 17, it can be said that the changes in film-forming conditions in any case do not have influence to the extent of increasing the leakage current to thereby affect characteristics.

-Twelfth Test-

In the twelfth test, after a MOS transistor was formed on the substrate, a W plug to be connected with a source or a drain thereof was formed, and a ferroelectric capacitor of a stack structure was formed thereon. When forming the ferroelectric capacitor, a Ti film having a thickness of 10 nm was formed as an adhesion film on a $SiO_2$ film that covered the MOS transistor, and into which the W plug had been embedded, and thereafter an Ir film was formed as a lower electrode. The Ir film effects as a barrier against oxygen. After that, a PZT film having a thickness of 120 nm was formed as a ferroelectric film by a MOCVD method. The PZT film formed at high temperature was crystallized. After that, an $IrO_x$ film was formed on the ferroelectric film under the same conditions as of the seventh test, and an $IrO_x$ film is formed further thereon. Subsequently, a wiring to be connected with the upper electrode was formed. Then, measurements were made to obtain polarization inversion amounts $Q_{sw}$ by setting the applied voltages to 1.8V and 3.0V.

Figure 18A:
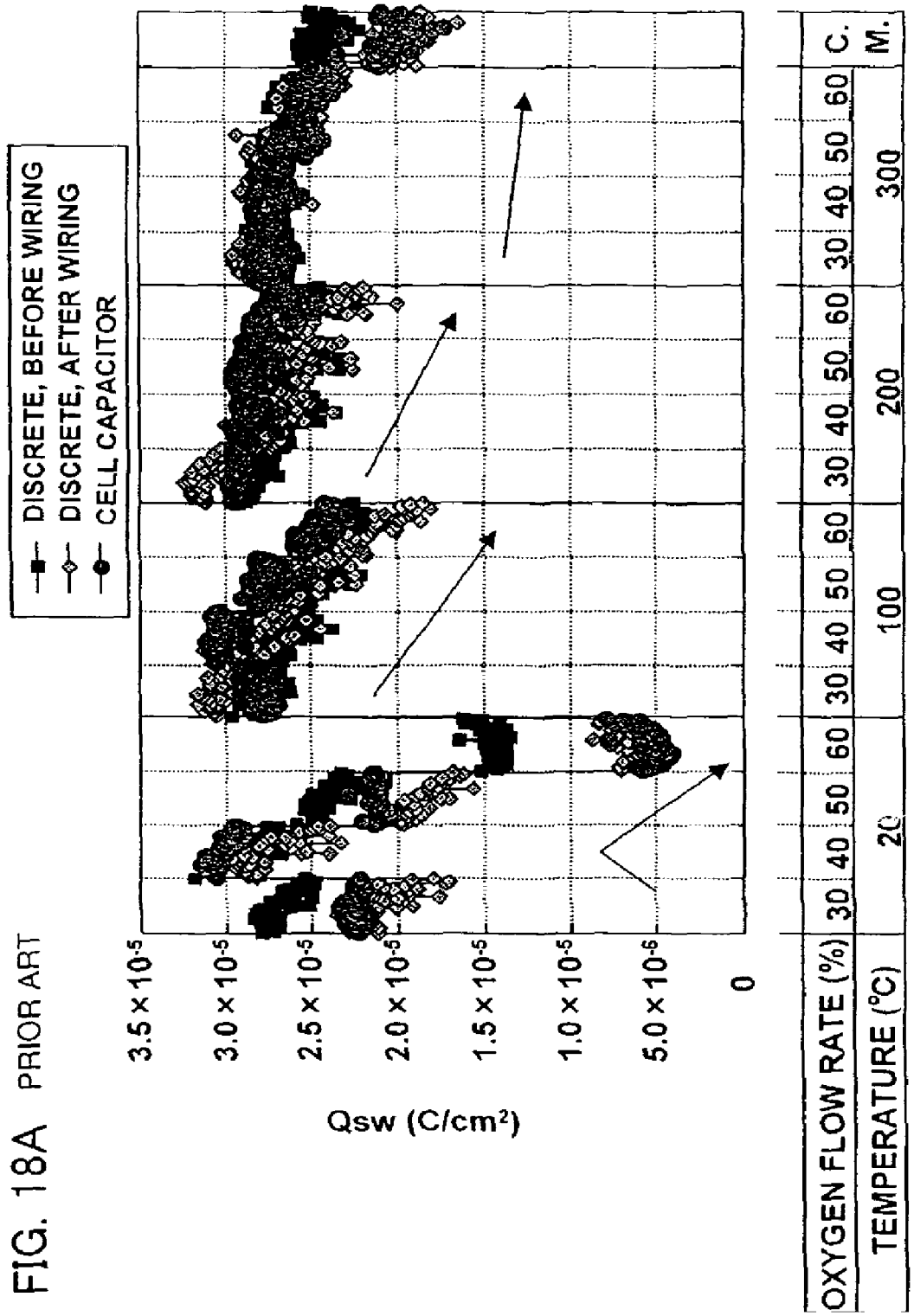
FIG. 18A is a graph showing a result of a twelfth test (1.8 V)

The FIG. 18A shows the result when the applied voltage was 1.8V, and FIG. 18B shows the result when the applied voltage was 3.0V. Note that, in FIGS. 18A and 18B, "DISCRETE" shows the result when a ferroelectric capacitor having the same size as of the first test was used as a sample, and a "CELL CAPACITOR" shows the result when a ferroelectric capacitor having the same size as of the second test was used as a sample. In the same manner, "BEFORE WIRING FORMATION" shows the result measured before forming the wiring to be connected with the upper electrode. Further, "CONVENTIONAL METHOD" in FIGS. 18A and 18B shows the result when measuring the sample manufactured by the conventional method shown in Patent document 1.

As shown in FIGS. 18A and 18B, at the deposition temperature of 200° C. or 300° C., higher polarization inversion amounts $Q_{sw}$ could be obtained stably. This means that the higher polarization inversion amount $Q_{sw}$ is obtainable even if the oxygen flow ratio varies, therefore the oxygen flow ratio can be said to have a wider margin. It should be noted, however, that the temperature to achieve the object of the present invention is not limited to 300° C.

On the other hand, in the conventional method (C. M.), the polarization inversion amount $Q_{sw}$ varied largely before and after the wiring formation in the case of the sample of discrete. This means that the characteristics of the ferroelectric capacitor degraded when forming the wiring.

-Thirteenth Test-

In the thirteenth test, samples of ferroelectric capacitors (cell capacitor) are formed under the same conditions as of the twelfth test and measurements were made to obtain leakage currents of the respective samples.

Figure 19:
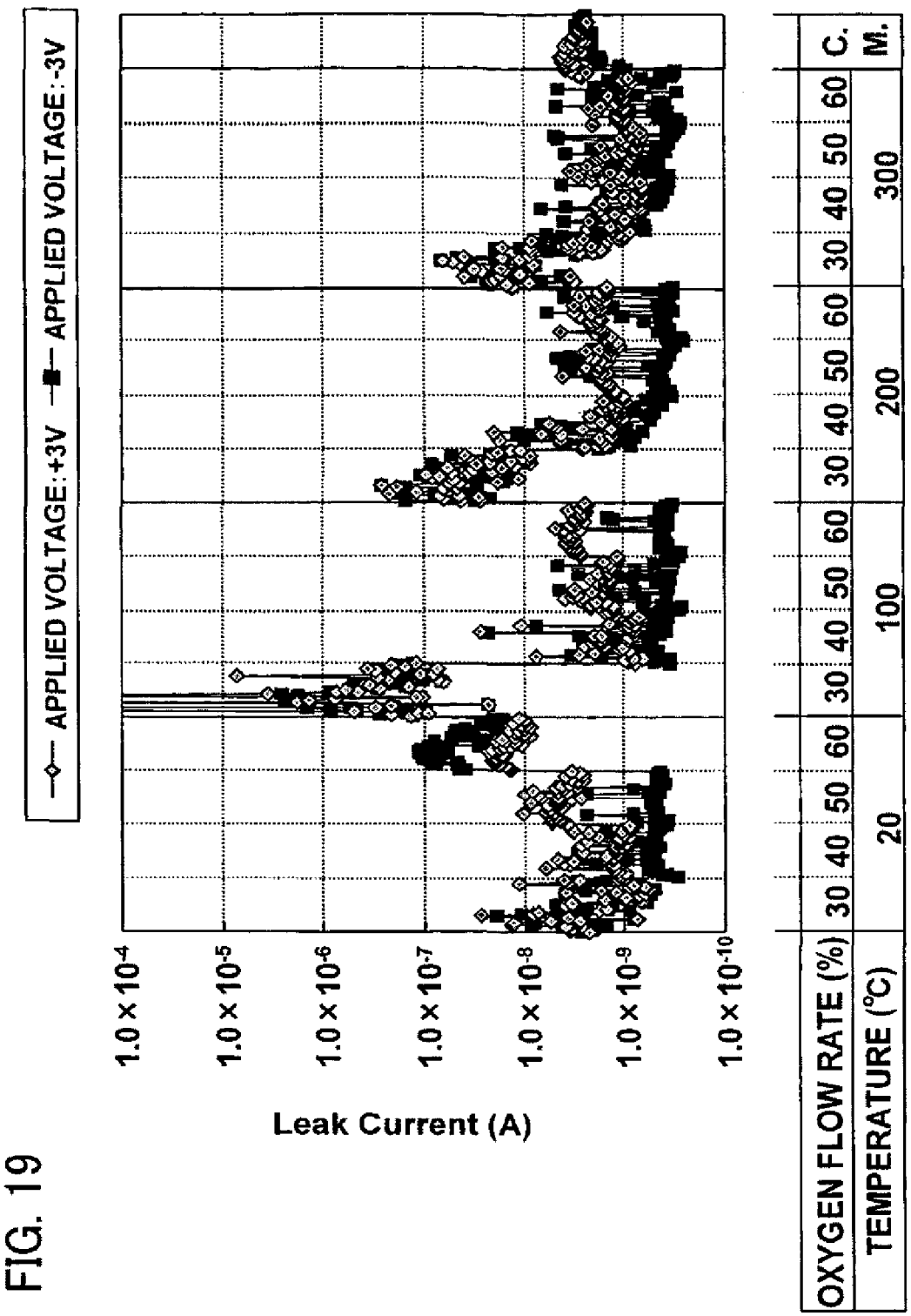
FIG. 19 is a graph showing a result of a thirteenth test.

FIG. 19 shows the results. Note that the applied voltage was set to ±3V that corresponds to the electrical potential of the lower electrode on the basis that of the upper electrode. As shown in FIG. 19, as the oxygen flow ratio lowered, the leakage current increased. If the oxygen flow ratio was 40% or higher, the leakage current came to lower than that of the sample manufactured by the conventional method.

-Fourteenth Test-

In the fourteenth test, samples of ferroelectric capacitor (discrete, cell capacitor) were formed by two kinds of methods (embodiment, conventional example) under the same conditions as of the twelfth test, and the relations between the applied voltage and the polarization inversion amount $Q_{sw}$ of the respective samples were researched. In the case of the embodiment, a crystallized $IrO_x$ film was formed directly on the ferroelectric film under the conditions: deposition temperature: 300° C., oxygen flow ratio: 40%. Incidentally, the ferroelectric film was formed by a MOCVD method.

Figure 20:
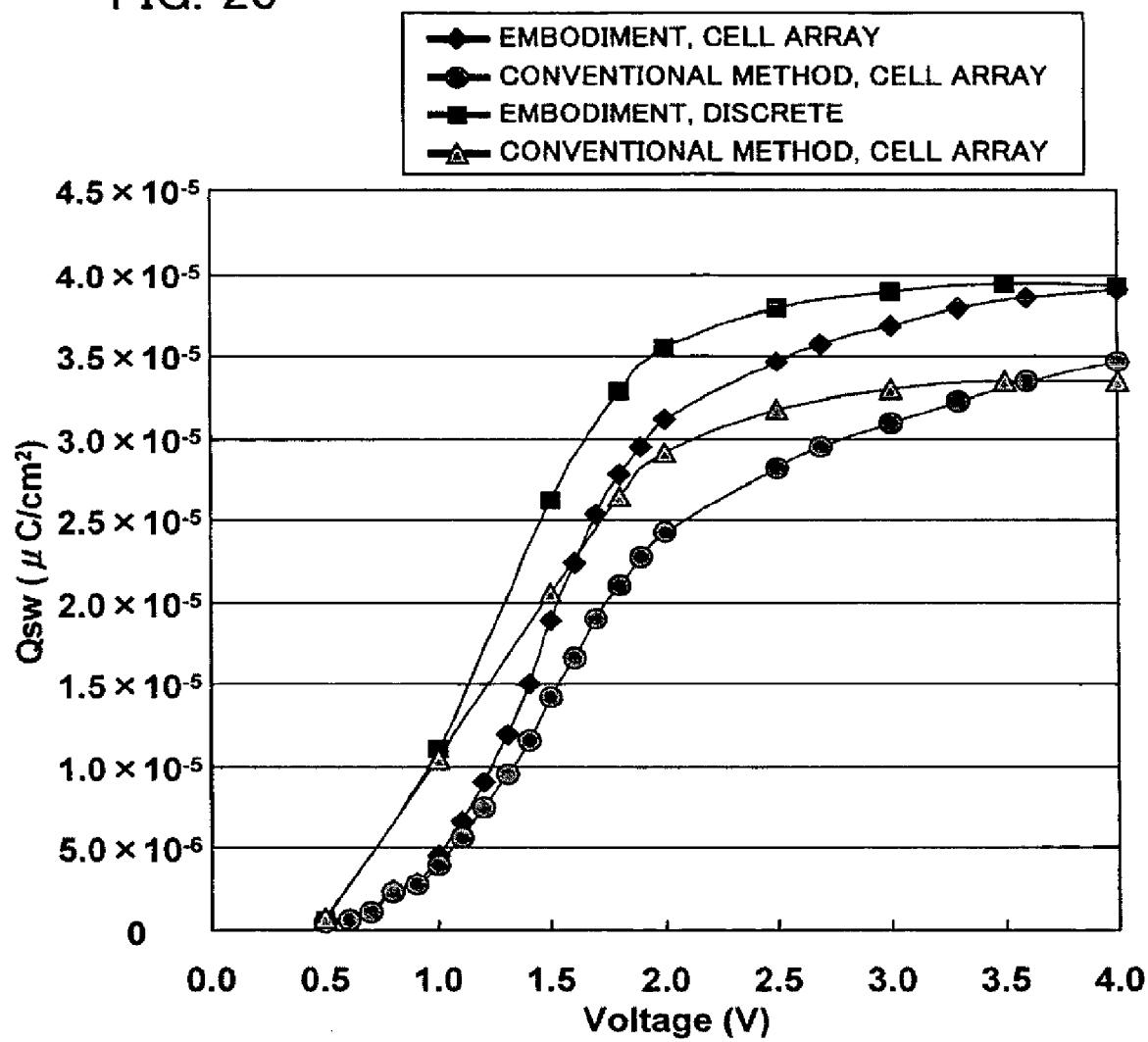
FIG. 20 is a graph showing a result of a fourteenth test.

FIG. 20 shows the result. As shown in FIG. 20, in the embodiment, the polarization inversion amount $Q_{sw}$ became higher than that of the conventional example, in both the discrete and the cell capacitor, and also their initial rises became sharp.

-Fifteenth Test-

In the fifteenth test, samples of ferroelectric capacitors (cell capacitor) were formed under the same conditions as of the twelfth test, and their polarization characteristics were researched. In the research, a value P, a value U, and a value P-U shown in FIG. 23 were obtained under various temperatures.

Figure 21:
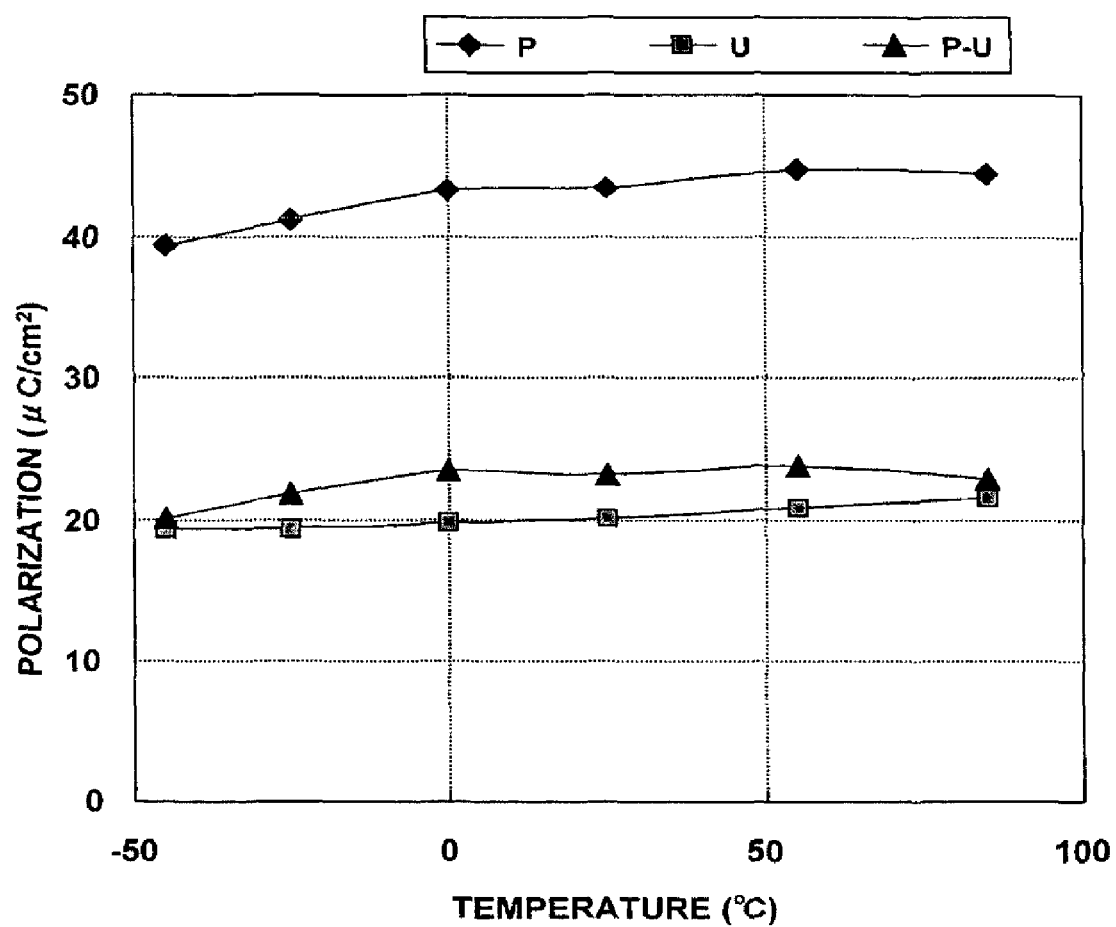
FIG. 21 is a graph showing a result of a fifteenth test.
Figure 22B:
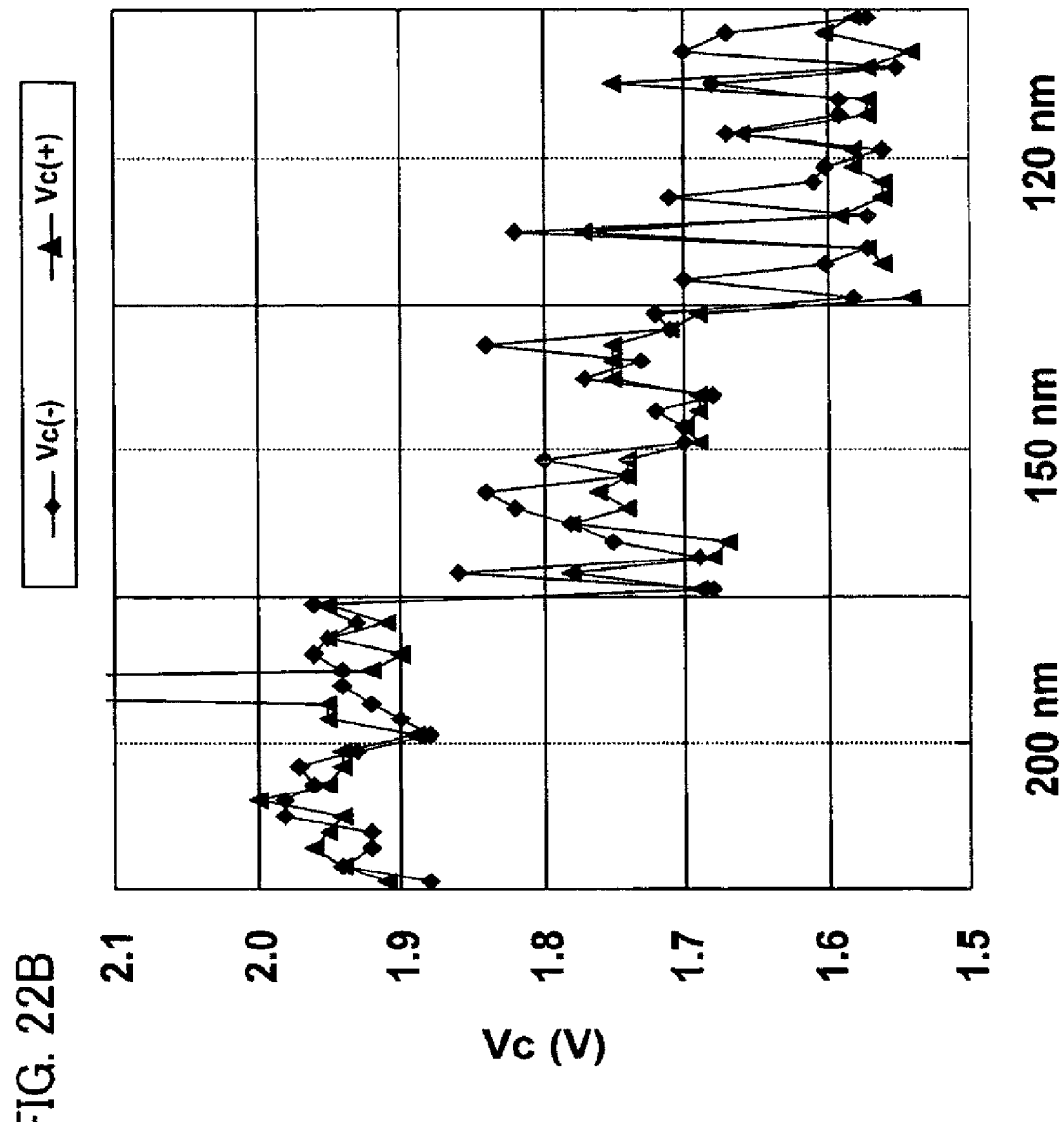
FIG. 22B is a graph showing a relation between the thickness and a coercive voltage Vc of a ferroelectric film.

FIG. 21 shows the results. As shown in FIG. 21, the value P, the value U, and the value P-U scarcely depend on the measurement temperatures. This indicates that a ferroelectric capacitor measured under these conditions can operate appropriately at a large range of temperatures.

Further, although not shown in the drawings, fatigue loss and imprint characteristic of the cell capacitor according to the embodiment of the present invention were measured. As a result, the fatigue loss of the embodiment was improved to 9% from 13% of the conventional example, and the imprint rate could be substantially improved to −2.8% from −6.5% of the conventional example.

Note that, as a ferroelectric film formation method, a sol-gel method, a metallo-organic deposition (MOD) method, a CSD (chemical solution deposition) method, a chemical vapor deposition method (CVD), and an epitaxial growth method can be cited in addition to the sputtering method and the MOCVD method. Meanwhile, as a ferroelectric film, for example, a film of which crystal structure becomes to have a bismuth-layer based structure or a perovskite structure by a thermal treatment may be formed. As such a film, in addition to the PZT film, films that are represented by a general chemical formula of $ABO_3$, such as PZT, SBT, BLT, a bismuth-layer structured compound, or the like that is doped minute amounts of lanthanum, calcium, strontium and/or silicon or the like may be cited.

Further, when forming the lowest layer of the upper electrode film, for example, a sputtering using a target containing platinum, iridium, ruthenium, rhodium, rhenium, osmium, and/or palladium may be conducted under the condition that the metal elements are caused to be oxidized. Specifically, when forming an iridium oxide film, the deposition temperature is preferably set at 20° C. to 400° C., for example at 300° C., and the oxygen partial pressure with respect to the pressure of oxygen gas and inert gas composing a sputtering gas is preferably set to 10% to 60%.

Further, the conductive film formed on the initial layer of the upper electrode film is not limited to the $IrO_x$ film, and a metal film containing platinum (Pt), iridium (Ir), ruthenium (Ru), rhodium (Rh), rhenium (Re), osmium (Os), and/or palladium (Pd), or the like may be formed, or otherwise an oxide film of these, such as a $SrRuO_3$ film may be formed.

Furthermore, as a conductive film, a film configured to have two or more layers may be formed.

According to the present invention, in a ferroelectric capacitor, the interface between an upper electrode and a ferroelectric film is brought to a favorable condition, so that sufficient ferroelectric characteristics can be obtained. Consequently, it is possible to obtain the ferroelectric capacitor exhibiting high polarization inversion amount, low coercive voltage, high fatigue tolerance, and high imprint resistance.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:
1. A method for manufacturing a semiconductor device comprising:
   forming a lower electrode film above a semiconductor substrate;
   forming a ferroelectric film on the lower electrode film; and forming an upper electrode on the ferroelectric film, wherein said upper electrode forming process includes a process of forming a conductive oxide film that is crystallized when formed at a lower layer of said upper electrode, and a conductive film on said conductive oxide film, wherein an orientation intensity to a (200) plane is higher than an orientation intensity to a (110) plane in said conductive oxide film, and wherein an average diameter of grains in said conductive oxide film is smaller than in said conductive film.

2. The method for manufacturing a semiconductor device according to claim 1, wherein said conductive oxide film forming process includes a process of conducting a sputtering using a target containing at least one kind of metal element selected from a group composed of platinum, iridium, ruthenium, rhodium, rhenium, osmium, and palladium, under a condition that the metal element is caused to be oxidized.

3. The method for manufacturing a semiconductor device according to claim 1, wherein, in said conductive oxide film forming process, the orientation of the conductive oxide film is controlled by controlling a temperature.

4. The method for manufacturing a semiconductor device according to claim 1, wherein, in said conductive oxide film forming process, the orientation of the conductive oxide film is controlled by controlling a partial pressure of oxygen in a sputtering gas.

5. The method for manufacturing a semiconductor device according to claim 2, wherein one including iridium is used as the target.

6. The method for manufacturing a semiconductor device according to claim 5, wherein, in said conductive oxide film forming process, the temperature is from 20° C. to 400° C.

7. The method for manufacturing a semiconductor device according to claim 6, wherein the temperature is 300° C.

8. The method for manufacturing a semiconductor device according to claim 6, wherein, in said conductive oxide film forming process, the partial pressure of the oxygen gas with respect to a pressure of oxygen gas and inert gas both composing the sputtering gas is 10% to 60%.

9. The method for manufacturing a semiconductor device according to claim 1, wherein, as the conductive film, a metal film containing at least one kind of metal element selected from the group composed of platinum, iridium, ruthenium, rhodium, rhenium, osmium, and palladium is formed.

10. The method for manufacturing a semiconductor device according to claim 1, wherein, as the conductive film, a conductive oxide film containing at least one kind of metal element selected from the group composed of platinum, iridium, ruthenium, rhodium, rhenium, osmium, and palladium is formed.

11. The method for manufacturing a semiconductor device according to claim 10, wherein, as the conductive film, a $SrRuO_3$ film is formed.

12. The method for manufacturing a semiconductor device according to claim 1, wherein, as the conductive film, a film configured to have two or more layers is formed.

13. The method for manufacturing a semiconductor device according to claim 1, wherein, as the ferroelectric film, a film of a crystal structure to be caused to have a bismuth-layer structure or a perovskite structure by thermal treatment is formed.

14. The method for manufacturing a semiconductor device according to claim 1, wherein the ferroelectric film is formed by a sol-gel method, a metallo-organic deposition method, a chemical solution deposition method, a chemical vapor deposition method, an epitaxial growth method, a sputtering method, or a MOCVD method.

* * * * *